(12) United States Patent
Goto et al.

(10) Patent No.: US 6,890,785 B2
(45) Date of Patent: May 10, 2005

(54) NITRIDE SEMICONDUCTOR, SEMICONDUCTOR DEVICE, AND MANUFACTURING METHODS FOR THE SAME

(75) Inventors: Osamu Goto, Miyagi (JP); Takeharu Asano, Miyagi (JP); Motonobu Takeya, Miyagi (JP); Katsunori Yanashima, Kanagawa (JP); Shinro Ikeda, Miyagi (JP); Katsuyoshi Shibuya, Miyagi (JP); Yasuhiko Suzuki, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/372,903

(22) Filed: Feb. 24, 2003

(65) Prior Publication Data

US 2003/0227026 A1 Dec. 11, 2003

(30) Foreign Application Priority Data

Feb. 27, 2002 (JP) ....................................... 2002-051583

(51) Int. Cl.$^7$ ............................................... H01L 21/00
(52) U.S. Cl. ......................... 438/46; 438/478; 438/481; 438/503; 438/507
(58) Field of Search ...................... 117/95, 952; 257/14, 257/15, 17, 18, 22, 190, 200, 401, 618, 623, 627, 628; 438/46, 47, 48, 478, 481, 483, 492, 503, 507, 532, 551, 552, 553, 763, 767, 968

(56) References Cited

U.S. PATENT DOCUMENTS

| | | | |
|---|---|---|---|
| 6,335,546 B1 * | 1/2002 | Tsuda et al. ................... 257/94 |
| 6,403,451 B1 | 6/2002 | Linthicum et al. | |
| 6,582,986 B2 * | 6/2003 | Kong et al. .................... 438/48 |
| 6,815,726 B2 * | 11/2004 | Ishida et al. ................... 257/94 |
| 2001/0025989 A1 | 10/2001 | Shibuya et al. | |
| 2002/0022290 A1 | 2/2002 | Kong et al. | |
| 2002/0048964 A1 * | 4/2002 | Yuasa et al. ................. 438/763 |
| 2002/0090816 A1 | 7/2002 | Ashby et al. | |
| 2003/0119239 A1 * | 6/2003 | Koike et al. ................. 438/200 |
| 2003/0143765 A1 | 7/2003 | Ishibashi et al. | |

* cited by examiner

Primary Examiner—Asok Kumar Sarkar
(74) Attorney, Agent, or Firm—Robert J. Depke; Holland & Knight LLP

(57) ABSTRACT

A nitride semiconductor having a large low-defect region in a surface thereof, and a semiconductor device using the same are provided. Also, a manufacturing method for a nitride semiconductor comprising a layer formation step using a transverse growth technique where surface defects can easily be reduced, and a manufacturing method for a semiconductor device using the same are provided. On a substrate, a seed crystal part is formed in a stripe pattern with a buffer layer in between. Next, crystals are grown from the seed crystal part in two stages of growth conditions to form a nitride semiconductor layer. Low temperature growing parts with a trapezoid shaped cross section are formed at a growth temperature of 1030° C. in the first stage and a transverse growth is dominantly advanced at a growth temperature of 1070° C. to form a high temperature growing part between the low temperature growing parts in the second stage. Thereby, hillocks and conventional lattice defects are reduced in a surface of the nitride semiconductor layer which is above the low temperature growing part.

7 Claims, 17 Drawing Sheets

NITRIDE SEMICONDUCTOR, SEMICONDUCTOR DEVICE, AND MANUFACTURING METHODS FOR THE SAME

This application claims priority to Japanese Patent Application Number JP2002-051583 filed Feb. 27, 2002, which is incorporated herein by reference.

BACKGROUND OF THE INVENTION

1. Field of the Invention

The present invention relates to a nitride semiconductor, for example, which is used for manufacturing a semiconductor laser device or the like, a semiconductor device using the same, and manufacturing methods for the same.

2. Description of the Related Art

In recent years, III-V group compound semiconductors attract attention as a device material because of their various characteristics. Especially these materials are direct transition type ones and have a band gap width ranging from 1.9 eV to 6.2 eV, so only these materials provide light emitting in a wide region raging from a visible region to an ultraviolet region, and developments thereof as a material of semiconductor light emitting devices such as a semiconductor laser and light emitting diode (LED) are actively progressing. In addition to their wide band gap width, it can be expected that they have high electron saturation velocity and a high breakdown field, so that they are studied also in terms of applications to devices which operates in conditions where conventional devices with a Si— or GaAs— material cannot theoretically operate such as a high temperature operation, a high speed switching operation, and a high electric current operation.

Of these III-V group compound semiconductors, gallium nitride semiconductors such as GaN, AlGaN, and GaInN are materials which are advantageously applied to the devices and such a semiconductor device has been produced by laminating a gallium nitride semiconductor film on a surface of a crystal substrate or a crystal film. The crystal substrate (or the crystal film) has desirably bulk crystals of a gallium nitride compound, but manufacturing such a kind of bulk crystals is difficult, so the gallium nitride compound is formed by epitaxial growth on a substrate such as sapphire ($\alpha$-Al$_2$O$_3$), silicon carbide (SiC), or the like in most cases.

However, there is a large difference in lattice mismatching and thermal expansion coefficient between the substrate material such as sapphire or the like and the gallium nitride compound, and lattice defects such as dislocation occur in a layer of the gallium nitride compound to relax distortion thereof. A lattice defect part serves as a center of non-radiative recombination, which emits no light even if an electron and a hole recombine, or as a leak part of electric currents, which causes damages of characteristics of the semiconductor devices.

Then, crystal growth methods have considered for removing the defects from the gallium nitride compound, and a growth technique, which utilizes a fact that little dislocation derived from seed crystals is in crystals growing in a transverse direction to the seed crystals used as a growth base, i.e., horizontally to a surface of a formed layer, is beginning to be applied to crystals of GaAs or GaN at present.

For example, Japanese Patent Laid-Open No. 10-312971 employs a method of forming a GaN layer on a sapphire substrate, forming a growth suppressing layer consisting of SiO$_2$ (silicon dioxide) on a surface of the GaN layer, and growing crystals of GaN based on a GaN surface exposing through the growth suppressing layer. According to the method, the growth suppressing layer suppresses growth of the dislocation, and an amount of the dislocation which penetrates crystals and reaches an upper surface thereof (so-called threading dislocation) is decreased. However, there is dislocation which passes through an opening part of the growth suppressing layer and penetrates the crystals, and dislocation and defects are increased locally in a region which is above the opening part of the gallium nitride semiconductor layer.

Other methods include a method of forming many seed crystal parts on a GaN layer by means of pattern formation and growing crystals in a transverse direction based on the seed crystal parts to connect the crystals being grown in the transverse direction among the seed crystal parts, for example. However, also in the method, the dislocation may spread to an upper surface of the seed crystal parts, so the region which is directly over the seed crystal parts becomes a region locally having many dislocation and defects. Therefore, using these methods is insufficient for reducing the defects of the surface of the gallium nitride semiconductor on a substrate, which is a problem.

Furthermore, the transverse growth in these methods is an incomplete selective growth, and an upward growth also occurs as well as the transverse growth, so that a thickness is rapidly increased during fully performing the transverse growth, and this may result in bowing in a formed gallium nitride semiconductor layer. Then, the inventors of the present invention have tried to grow a gallium nitride semiconductor at a temperature higher than conventional methods so that the transverse growth should proceed dominantly, in order to obtain a thin layer thickness. As the growth temperature is higher, directivity of the growth direction becomes stronger and the transverse growth is further promoted, but now a defect called a hillock may occur in a layer surface. The hillock is a crater-like protrusion with a diameter of 70 $\mu$m–100 $\mu$m and a height of about 0.7 $\mu$m, and experiments have revealed that the hillocks tend to grow mainly right over the seed crystal parts (or the opening part of the growth suppressing layer). Defects may occur in the semiconductor layer being grown on the hillocks and this may damage characteristics of the produced semiconductor device. In the case of the semiconductor laser, when laser stripes are formed on the hillocks, there are problems of lowering reliability such as laser static characteristics and a life of the laser.

SUMMARY OF THE INVENTION

The present invention has been achieved to solve the above problems. It is a first object of the invention to provide a nitride semiconductor having a large low-defect region in a surface thereof, and a semiconductor device using the same.

The second object of the invention is to provide a manufacturing method for a nitride semiconductor comprising a layer formation step which can easily accomplish few surface defects using a transverse growth technique, and a manufacturing method of a semiconductor device using the above method.

Manufacturing methods for a nitride semiconductor and for a semiconductor device according to the invention comprise the steps of growing a group III-V nitride semiconductor to form a seed crystal part; and growing a group III-V nitride semiconductor based on the seed crystal part with changing at least one of growth conditions in two or more stages to form a semiconductor layer.

A nitride semiconductor and a semiconductor device according to the invention comprises: a first seed crystal part made of a group III-V nitride semiconductor; a second seed crystal part which is made of a group III-V nitride semiconductor and grows from the first seed crystal part to have a triangle or trapezoid shaped cross section; and a semiconductor layer which is made of a group III-V nitride semiconductor and grows based on the second seed crystal part.

In the manufacturing methods for the nitride semiconductor and for the semiconductor device according to the invention, the group III-V nitride semiconductor is grown based on the seed crystal part with changing at least one of the growth conditions in two or more stages, a spreading direction of dislocation in a region above the seed crystal part is changed, and the semiconductor layer with reduced hillocks is formed.

The nitride semiconductor and the semiconductor device according to the invention comprise the second seed crystal part which has the triangle or trapezoid shaped cross section, and the semiconductor layer which grows based on the second seed crystal part, so the dislocation in crystals is bent on an interface between the second seed crystal part and the semiconductor layer, and this decreases the dislocation penetrating to a surface of the semiconductor layer.

Other and further objects, features and advantages of the invention will appear more fully from the following description.

DETAILED DESCRIPTION OF THE PREFERRED EMBODIMENTS

Embodiments of the present invention will be described in detail below with reference to accompanying drawings.
[First Embodiment]

FIGS. 1A to 5B explain a manufacturing method for a nitride semiconductor according to a first embodiment of the present invention in order. At first, the embodiment will explain the manufacturing method for the nitride semiconductor referring to these Figures. The nitride semiconductor here is a gallium nitride compound containing gallium (Ga) and nitrogen (N), and examples thereof can include GaN, an AlGaN (aluminum gallium nitride) mixed crystal, and an AlGaInN (aluminum gallium indium nitride) mixed crystal. They may contain an n-type impurity consisting of a group IV or VI element such as Si (silicon), Ge (germanium), O (oxygen), or Se (selenium), or a p-type impurity consisting of a group II or IV element such as Mg (magnesium), Zn (zinc), or C (carbon), if needed.

Figure 1A:
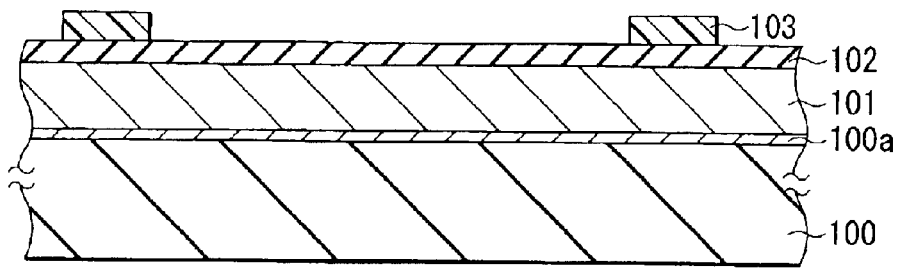
FIGS. 1A to 1D are cross sectional views respectively for explaining steps of a manufacturing method of a nitride semiconductor according to a first embodiment of the invention.

First, as shown in FIG. 1A, a substrate 100 made of $Al_2O_3$ (sapphire) is prepared. Others which can be used as the substrate 100, include Si (silicon), SiC (silicon carbide), GaAs (gallium arsenide), $MgAl_2O_4$ (magnesium aluminum composite oxide), $LiGaO_2$ (lithium gallium composite oxide), and GaN. On the substrate 100 (for example, a {0001} surface), a buffer layer 100a made of GaN, AlN, AlGaN, or the like is formed. Next, GaN:Si is grown on the buffer layer 100a to form a seed crystal layer 101, for example, with a thickness of 2 μm, and thereon are formed a $SiO_2$ (silicon dioxide) film 102 with a thickness of 0.9 μm and a photoresist film 103 with a thickness of 1.3 μm in order. It should be noticed that $Si_xN_y$ (x and y of silicon nitride are given values) may be formed instead of the $SiO_2$ film 102, or a laminate film of $SiO_2$ and $Si_xN_y$ may be formed.

On the other hand, in the embodiment, a MOCVD (Metal Organic Chemical Vapor Deposition) is used for growth of the crystal layer of the nitride semiconductor, for example.

In that case, (CH₃)₃Ga (trimethyl gallium, TMG) is used as a source gas of Ga (gallium), (CH₃)₃Al (trimethylaluminum) is used as a source gas of aluminum, (CH₃)₃In (trimethyl indium) is used as a source gas of indium, and ammonia is used as a source gas of nitrogen. Moreover, monosilane is used as a source gas of Si (silicon), and (C₅H₅)₂Mg (bis=cyclopentadienyl magnesium) is used as a source gas of Mg (magnesium).

Next, the photoresist film 103 is patterned into a stripe pattern using a photo lithography technique. The pattern is formed to have a size such as a width of 2 μm in a spread direction of <1$\bar{1}$00> and a cycle width of 13.5 μm.

Figure 1B:
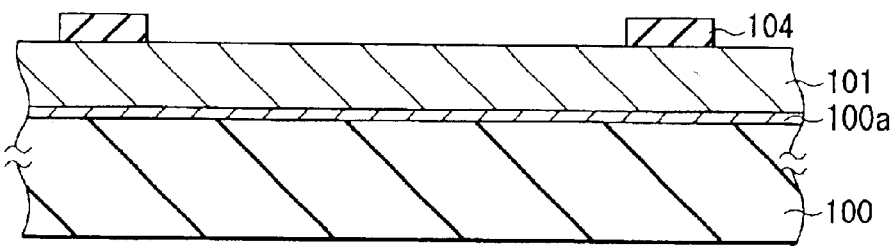

Next, as shown in FIG. 1B, etching is performed on the SiO₂ film 102 using the photoresist film 103 as a mask, and the SiO₂ film 102 is partially removed to form a mask pattern 104. After formation of the mask pattern 104, the photoresist film 103 is removed with oxygen ashing, acetone processing, or the like.

Figure 1C:
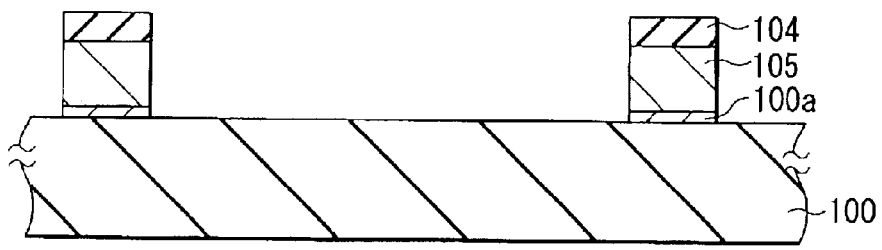

Next, as shown in FIG. 1C, dry etching such as RIE (Reactive Ion Etching) is performed, and parts without being covered with the mask pattern 104 in the seed crystal layer 101 and the buffer layer 100a are removed to form a stripe-like seed crystal part 105 in which stripes are separated mutually.

Figure 1D:
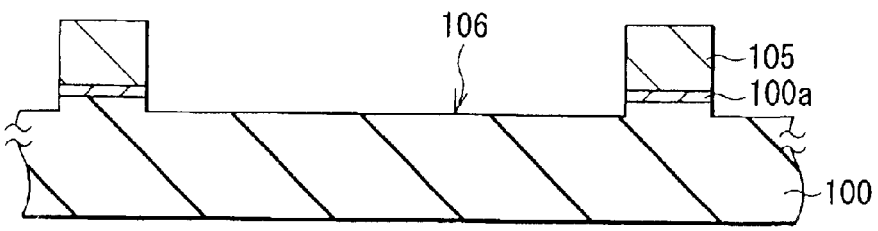

Then, the dry etching using the mask pattern 104 is performed similarly, and a surface of the substrate 100, for example, of about 200 nm in thickness, is slightly removed, to form a groove 106 as shown in FIG. 1D. Without forming the groove 106, when a layer is grown in a transverse direction from a seed crystal part 105 described below, it may be in contact with the surface of the substrate 100 and defects resulting from stress distortion may occur in the layer. Subsequently, the mask pattern 104 made of SiO₂ is removed, for example, using hydrogen fluoride aqueous solution.

Figure 2:
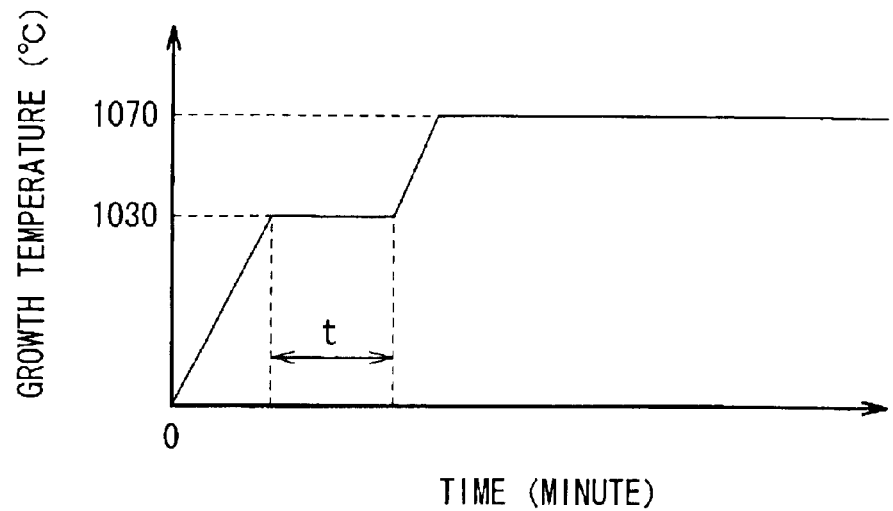
FIG. 2 is a view for explaining a method of controlling a growth temperature of the nitride semiconductor according the first embodiment of the invention.

Next, a nitride semiconductor layer 107 is formed by growing GaN:Si based on the seed crystal part 105. At that time, growth conditions are changed twice or more for growing crystals, and in the embodiment a growth temperature is changed in two stages as shown in FIG. 2 for performing the growth.

In a first stage, the growth temperature is set to 1040° C. or below, for example, to 1030° C. It should be noticed that the growth temperature depends on kinds of a susceptor and a heater line to be used and on a relative position of a thermocouple and thus is not generally specified, and that errors due to a difference in a measuring system are also allowed in the specification. A conventional growth temperature for performing the transverse growth based on seed crystals is around 1060° C., but in the embodiment a desirable condition is a comparatively low temperature of about 1040° C. or below. In such a case, the crystals of GaN:Si grow isotropically at a comparatively low speed in upward and transverse directions from an upper surface and a side face of the seed crystal part 105. The transverse direction in the specification means a direction almost parallel to an upper surface of the nitride semiconductor layer 107 itself.

Figure 3A:
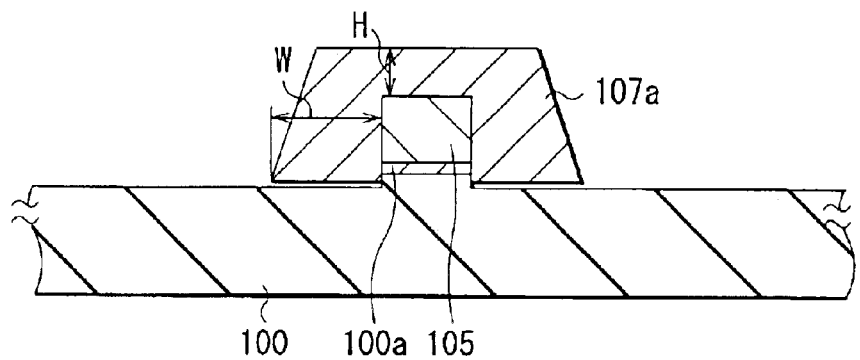
FIGS. 3A and 3B are cross sectional views respectively for explaining steps following the step of FIG. 1D.

Thereby, as shown in FIG. 3A, low temperature growing part 107a with a trapezoid shaped cross section in a thickness direction of the layer are formed. A height H of the low temperature growing part 107a which is from the upper surface of the seed crystal part 105 and a width W from the seed crystal part 105 to an outer edge of the low temperature growing part 107a are especially not limited, but the height H is related to a surface-defect density of the nitride semiconductor layer 107 as described later, and it is desirable to grow it until the height H reaches a predetermined value, for example, of 0.5 μm or more. When the growth temperature is 1030° C., a ratio of growth speeds (a speed in the upward direction: a speed in the transverse direction) is about 1:2, and, for example, the cross section of the low temperature growing part 107a has a trapezoid shape with the height H of 0.5 μm and the width W of 1.0 μm after 10 minutes. In addition, slant faces thereof are growth surfaces of the transverse growth and are facets made of a crystal surface of {11$\bar{2}$2}.

Figure 3B:
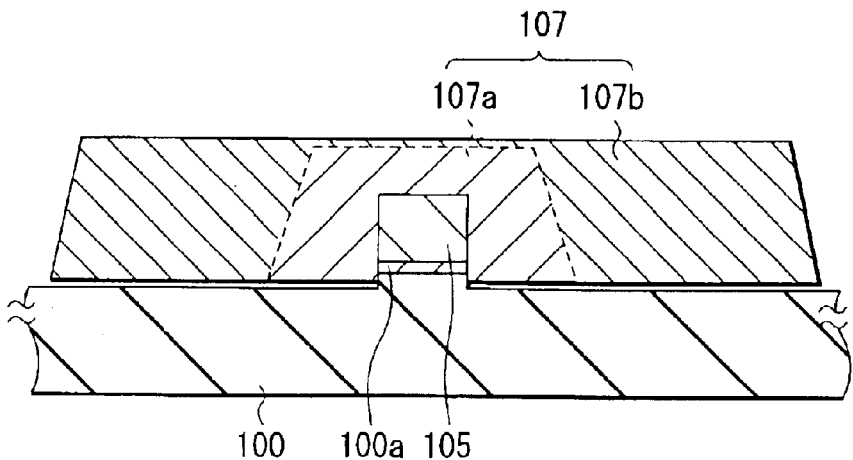
Figure 4:
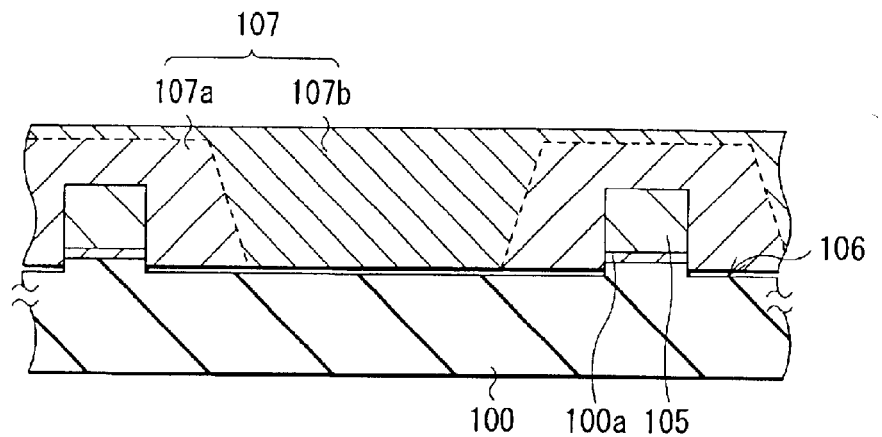
FIG. 4 is a cross sectional view for explaining a step following the step of FIG. 3B.

In a following second stage, the growth temperature is set to a temperature which is 1070° C. or above and is higher than the growth temperature in the first stage. Here, the temperature is increased to 1070° C., for example, to perform the crystal growth. The growth of GaN:Si crystals proceeds generally at a speed higher than that of the first stage, but a growth speed from the seed crystal part 105 in the transverse direction is higher than that in the upward direction, so that they grow mainly in the transverse direction. Here, a ratio of (the growth speed in the upward direction: the growth speed in the transverse direction) is about 1:10. In such way, a high temperature growing part 107b is formed. Therefore, as shown in FIG. 3B, in the high temperature growing part 107b, a height H is not substantially increased compared with that in the first stage, but a width W thereof is increased rapidly. As the growth is continued, growing parts of the high temperature growing part 107b mutually connect approximately at a center of a region corresponding to a region between the seed crystal parts 105, and one sequential layer is formed. When the crystals are grown until the upper surface of the layer becomes flat, the nitride semiconductor layer 107 shown in FIG. 4 is completed.

Figure 5A:
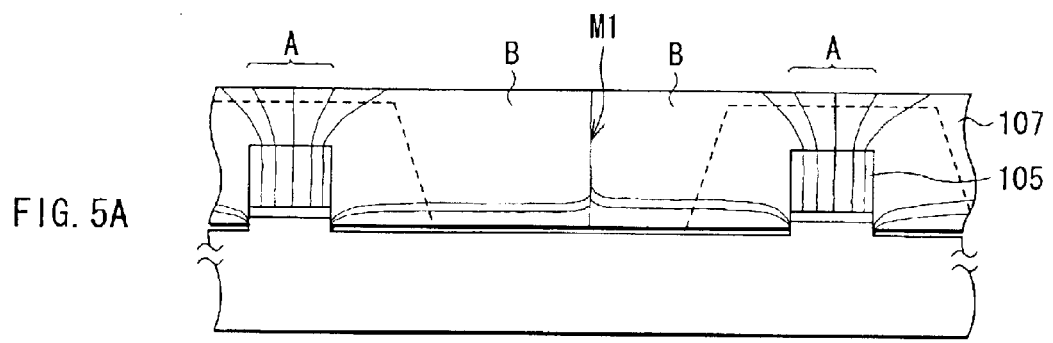
FIGS. 5A and 5B are views for comparing occurrence of dislocation density between formation of the nitride semiconductor with changing a temperature condition in two stages (FIG. 5A) and formation of the nitride semiconductor at a fixed temperature (FIG. 5B).

FIG. 5A shows a situation in which dislocation spreads from the crystal parts 105 to the nitride semiconductor layer 107. In the nitride semiconductor layer 107 of the embodiment, regions A, which are right above the seed crystal parts 105, are mainly composed of the low temperature growing parts 107a, and few hillocks are generated on surfaces thereof, which is not shown here. Moreover, threading dislocation in the regions is dispersed to the upper surface of the nitride semiconductor layer 107 which is grown so that the upper surfaces of the seed crystal parts 105 may expand, and this reduces a density of the threading dislocation. On the other hand, the threading dislocation, which reaches the facets obtained by the transverse growth during the formation of the low temperature growing parts 107a, is bent in the transverse direction as the crystals are grown. Therefore, very little dislocation spread from the seed crystal parts 105 to the regions A.

Figure 5B:
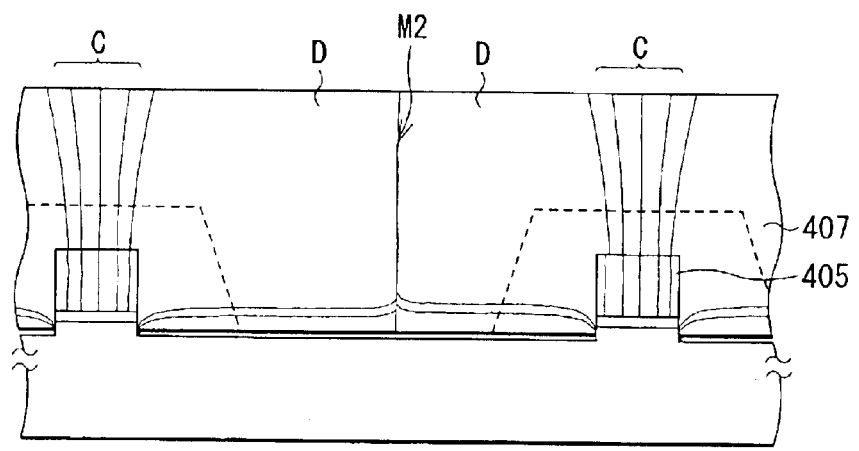

Transverse growth regions B which grow between the seed crystal parts 105 are mainly composed of the high temperature growing part 107b. In a connection part M1 of the regions B, the threading dislocation occurs due to the connection of the regions B, but the dislocation from the seed crystal parts 105 hardly spread in the transverse direction, and the dislocation density becomes very low. Therefore, except for the connection part M1, few parts having many defects are produced in the upper surface of the nitride semiconductor layer 107, so that a low-defect region in the upper surface becomes larger. In addition, the high temperature growing part 107b grows promptly, so it is possible to extend a width of the region B, for example, to about 16 μm, and to expand the low-defect region. FIG. 5B shows a crystal layer 407 which is grown from a seed crystal part 405 at a constant growth temperature in a transverse direction like a conventional way for comparison. A dislocation density of transverse growth regions D is the same as that of the transverse growth regions B in FIG. 5A. However, regions C, which are right above the seed crystal parts 405, have the same level of a high dislocation density as that of the seed crystal parts 405, because the threading dislocation spreads from the seed crystal parts 405.

Moreover, the nitride semiconductor layer 107 in such a case hardly grows upward in the growth of the second stage, so that the height H becomes as thin as about 3 μm. On the other hand, the crystal layer 407 is grown consistently at the same ratio both in the upward and transverse directions, so a layer thickness thereof becomes larger than the nitride semiconductor layer 107 and this causes curvature of the crystal layer 407. That is, in the nitride semiconductor layer 107, the curvature is prevented because of the thin layer thickness.

EXAMPLES

Next, Examples of such a nitride semiconductor layer 107 are concretely shown.

Like the embodiment, the seed crystal part 105 was formed, and GaN was grown to form the nitride semiconductor layer 107, as the growth temperature was adjusted in accordance with a heat curve in FIG. 2. At that time, the temperature of the first stage was changed from 1030° C. to 1070° C., the temperature of the second stage was fixed to 1070° C., and a hillock density of the formed nitride semiconductor layer 107 was estimated.

Figure 6:
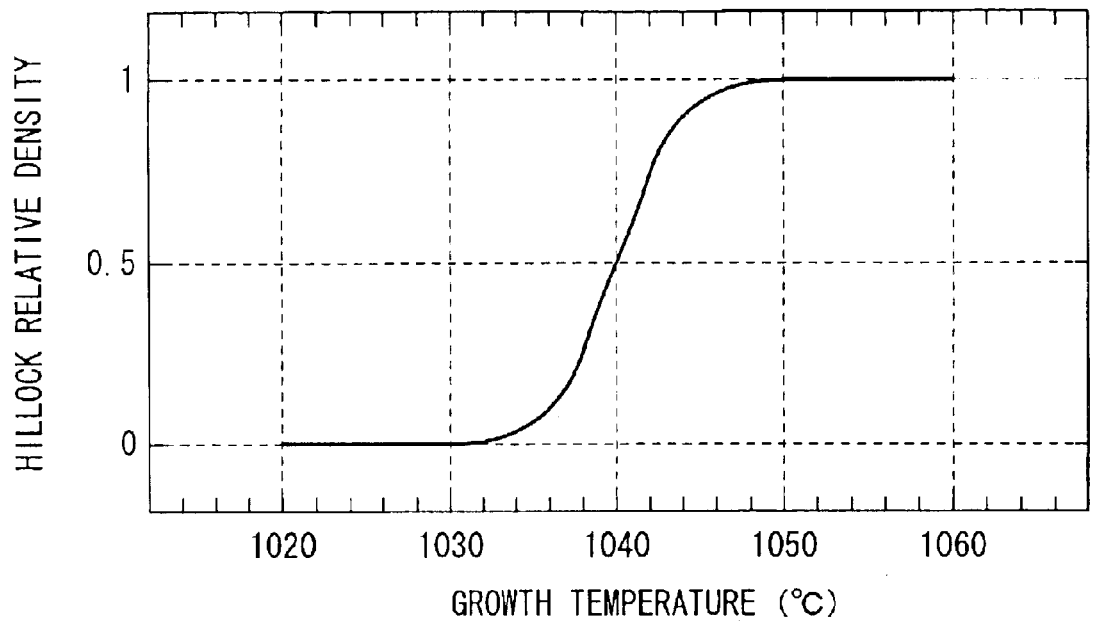
FIG. 6 is a view showing a hillock relative density to the growth temperature in a first stage in Example of the invention.

FIG. 6 shows a hillock relative density to the growth temperature in the first stage. As shown in FIG. 6, a generating situation of the hillocks has correlation with the growth temperature of the first stage, and a low temperature region with little hillocks (where a relative ratio of the hillock density is 0) and a high temperature region with many hillocks (where the relative ratio of the hillock density is 1) are observed. Change between two states is not drastic, one state is transited gently through a hillock density changing region to the other state shown in FIG. 6, and a temperature at a center of the changing region was about 1040° C. in Example. This reveals that the growth temperature in the first stage is desirably 1040° C. or below.

Furthermore, like the above embodiment, the temperature in the first stage was set to 1030° C. and the temperature in the second stage was set to 1070° C. in accordance with the heat curve shown in FIG. 2, and the nitride semiconductor layer 107 made of GaN was formed. At that time, growth time in the first stage (a period t in FIG. 2) was changed to 0, 3, 5, 10, and 20 (unit:minutes), a surface of the formed nitride semiconductor layer 107 was observed in each case, and the hillock density was estimated.

Figure 7:
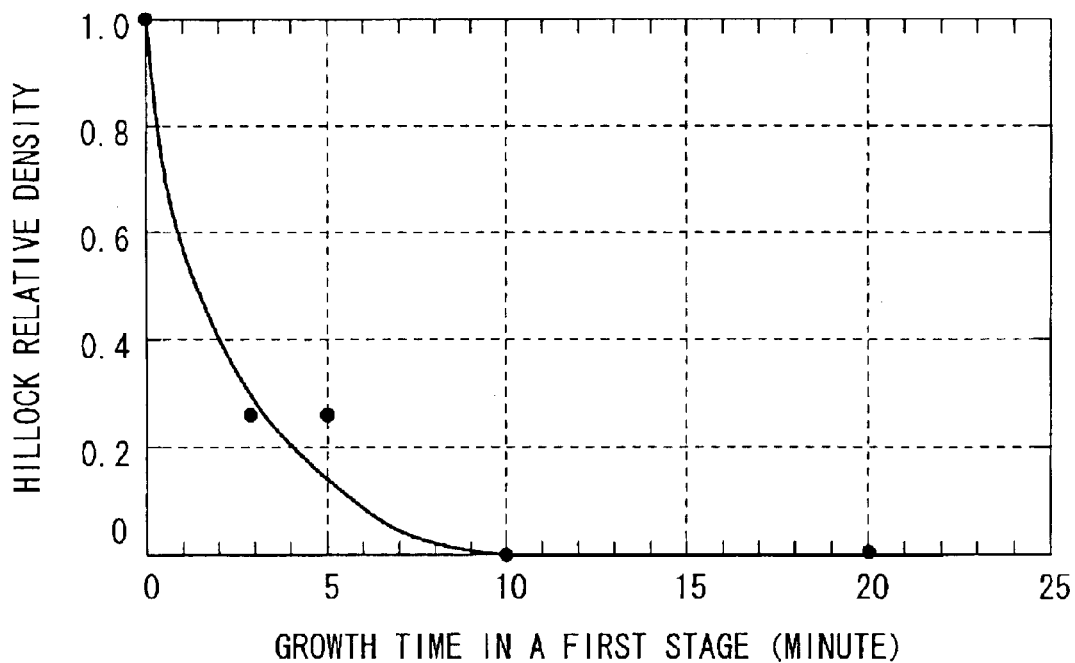
FIG. 7 is a view showing the hillock relative density to growth time in the first stage in Example of the invention.

A relation of a hillock relative density value to the growth time in the first stage is shown in FIG. 7. In the above temperature conditions, 10 minutes is a critical value of duration of the first stage, the hillock relative density decreases in proportion to the time and is 0 at 10 minutes. Even when the low temperature growing parts 107a are grown with spending time more, the hillock relative density is still 0. The low temperature growing parts 107a, which were grown for 10 minutes in the first stage, had a shape with the height H of 0.5 μm and the width W of 1.0 μm in FIG. 3A. Therefore, it is thought that a condition for generating no hillock in the nitride semiconductor layer 107 in the above circumstances is to form the low temperature growing parts 107a with the height H of at least 0.5 μm or more.

Figure 8:
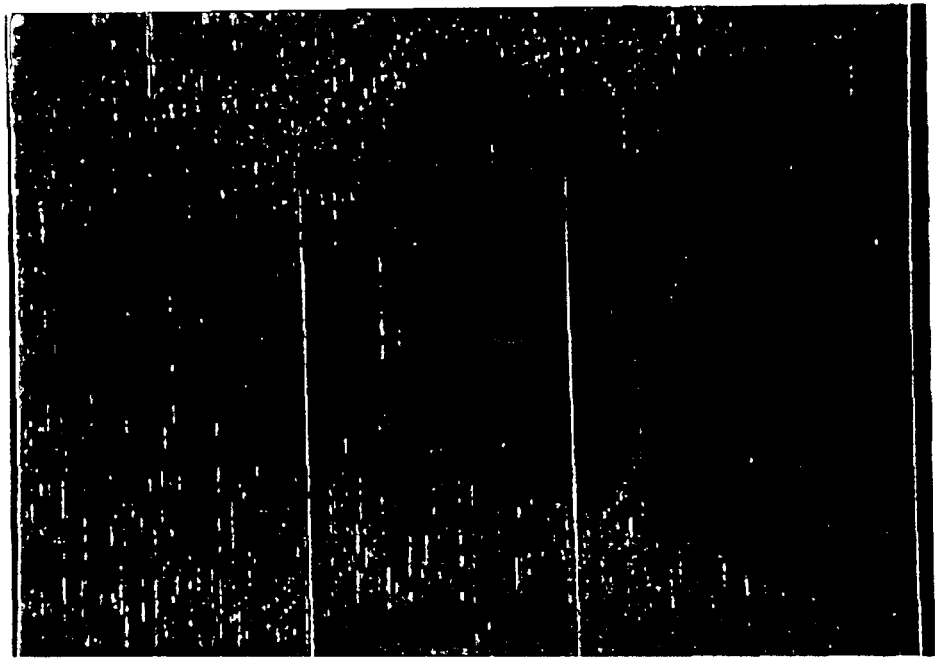
FIG. 8 is a micrograph of the nitride semiconductor layer of Example.
Figure 9:
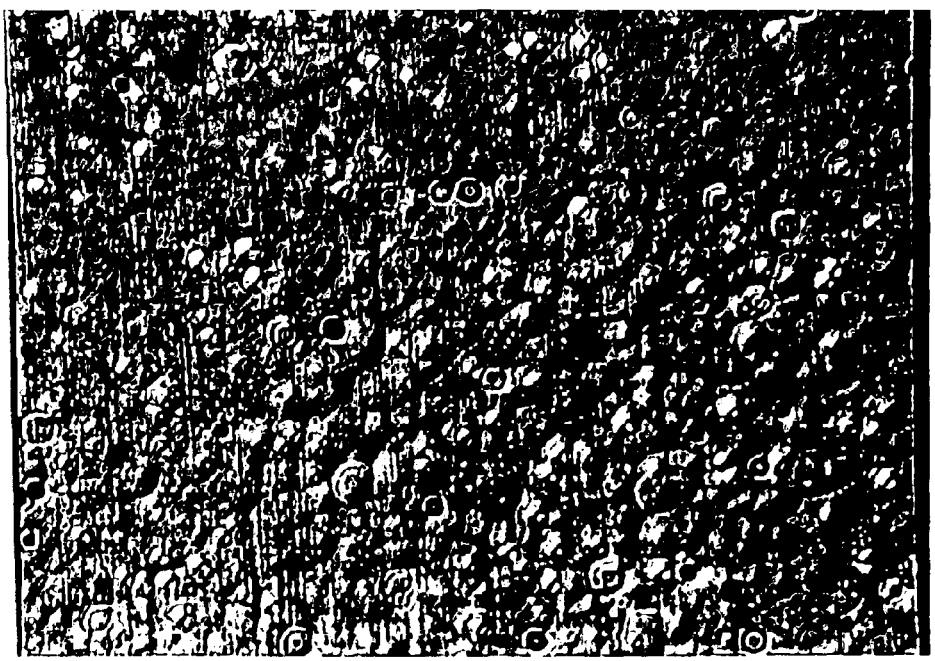
FIG. 9 is a micrograph of the nitride semiconductor layer of Comparative Example.

FIG. 8 is a photograph of the surface of the nitride semiconductor layer 107 which was grown in the two stages as described above, and FIG. 9 is a photograph of a surface of a nitride semiconductor layer formed by a conventional method as Comparative Example. FIG. 9 shows that abundant hillocks occurred, but no hillock was observed in FIG. 8. In addition, in the nitride semiconductor layer 107 in FIG. 8, a non-dislocation region on the surface thereof, where no dislocation was observed, spread even to an upper part of the seed crystal part 105 (referring to FIG. 5A), and a width thereof was no less than 13.5 μm. On the other hand, in the nitride semiconductor layer in FIG. 9, the non-dislocation region existed partially between the seed crystal parts, and the width thereof was 9 μm.

Therefore, Examples reveal that the nitride semiconductor layer 107 has the low-defect region, which is larger than that of the conventional ones, on the surface which is homogeneous and flat. Moreover, Examples reveal that when the growth temperature in the first stage is 1040° C. or less, the nitride semiconductor layer 107 as described above can be obtained effectively.

Thus, in the embodiment, the step of growing the nitride semiconductor layer 107 is divided into two stages with changing the growth temperature, and most of the regions above the seed crystal parts 105 are formed in the first stage of the low temperature growing. This can prevent the hillocks from being generated in the surface thereof, inhibit the thickness of the layer from further being increased, and provide a thin thickness thereof. Moreover, the low temperature growing parts 107a formed in the first stage have the trapezoid shaped cross section, which can reduce the defect density in the part above the seed crystal parts 105. After the first stage, the transverse growth is selectively performed at the temperature higher than that of the first stage in the second stage, so that no defect may occur even when the growth temperature is high, and the high temperature growing part 107b can be formed more rapidly.

Moreover, in the embodiment, a growth direction is changed in two stages by changing the growth temperature, so the crystals grow in both of a region close to the seed crystal parts 105 and the region between the seed crystal parts 105 in suitable conditions. Therefore, few defects exists in the surface of the nitride semiconductor layer 107 except for the connection part M1, the large low-defect region can be formed therein. Simultaneously, the nitride semiconductor layer 107 can be formed to be thin and have low defects, and the occurrence of the curvature can be prevented.

Therefore, the nitride semiconductor layer 107 manufactured in such a way has characteristics such as the large low-defect region being in the surface with few hillocks, and the thin thickness.

[Modification]

A modification provides a seed crystal part with a shape different from the seed crystal part 105 of the first embodiment, and a manufacturing method comprising a step of forming the nitride semiconductor layer 117 being different from one of the first embodiment. Hereinafter, the manufacturing method will be described concretely.

Figure 10A:
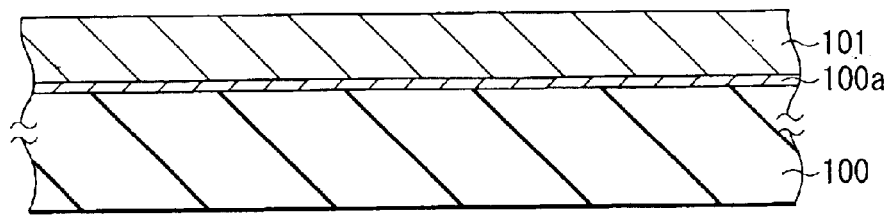
FIGS. 10A to 10D are cross sectional views respectively for explaining steps of a manufacturing method of a nitride semiconductor according to a modification of the first embodiment.

FIGS. 10A–10D show the above manufacturing method of the nitride semiconductor layer 117 in order of steps thereof. First, as shown in FIG. 10A, the buffer layer 100a, for example, made of GaN, AlN, AlGaN, or the like, and the seed crystal layer 101 made of GaN:Si are grown in order on the substrate 100 like the first embodiment.

Figure 10B:
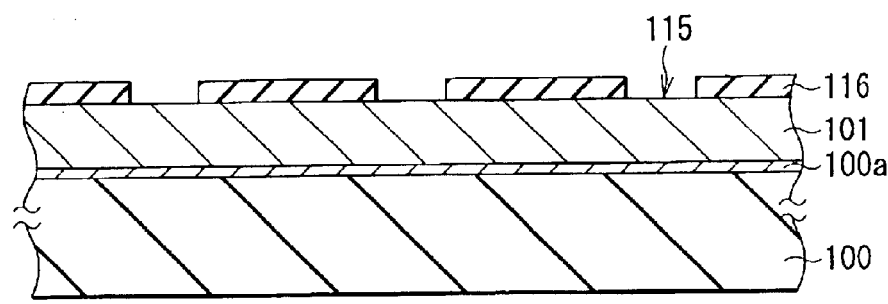

Next, as shown in FIG. 10B, a growth suppressing layer 116 made of SiO$_2$ (silicon dioxide) is grown on a surface of the seed crystal layer 101. The growth suppressing layer 116 is formed, for example, by spattering, in order to have a desired shape with an opening, for example, a stripe pattern with a certain stripe width and cycle width, by means of a photo lithography technique and dry etching. Here, a part exposed from the opening of the seed crystal layer 101 becomes a seed crystal part 115.

Next, GaN:Si is grown based on the seed crystal part 115 to form the nitride semiconductor layer 117. Also in such a case, growth conditions are changed twice or more to grow the crystals, and here the growth temperature is changed in two stages like the above embodiment.

Figure 10C:
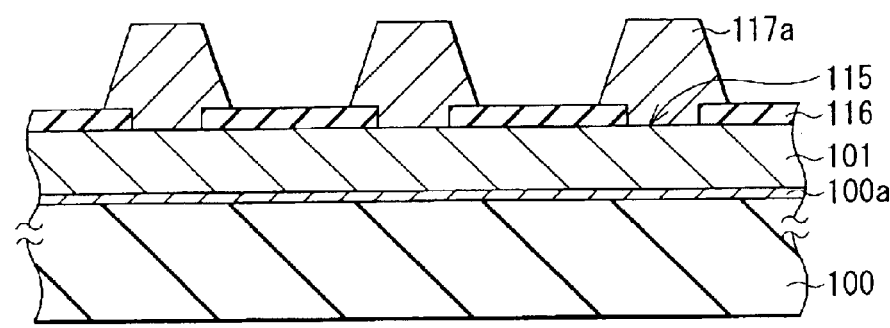

First, the growth temperature is 1040° C. or less, for example, 1030° C., in a first stage. In such a case, the crystals of GaN:Si grow isotropically at a comparatively low speed from upper surfaces of the seed crystal parts 115 in the upward and transverse directions, to form low temperature growing parts 117a with a trapezoid-shaped cross section as shown in FIG. 10C. A height H of the low temperature growing part 117a which is from the upper surface of the seed crystal part 115 and a width W thereof are especially not limited, but the height H is related to a surface-defect density of the nitride semiconductor layer 117 described later, and it is desirable to grow it until the height H reaches a predetermined value, for example, 0.5 μm or more. Here, slant faces of the low temperature growing part 117a are growth surfaces of the transverse growth and are facets composed of the $\{11\bar{2}2\}$ crystal surface.

Figure 10D:
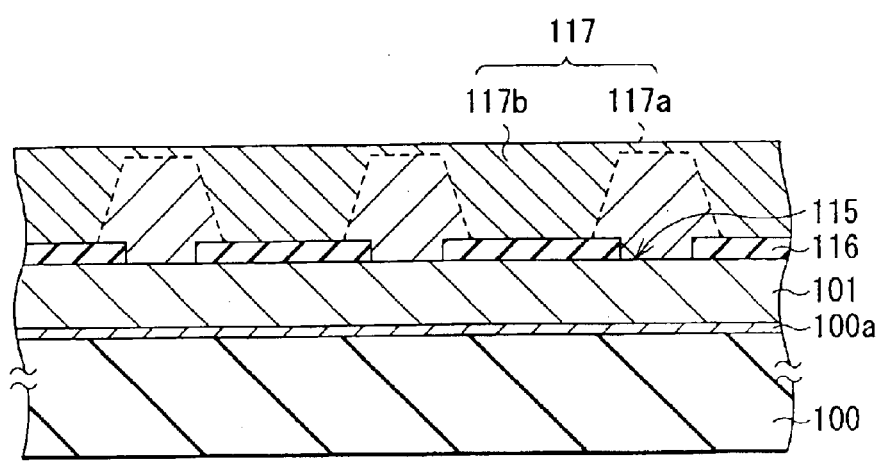

In a second stage, the growth temperature is set to a temperature which is 1070° C. or above and is higher than the growth temperature in the first stage. Here, the temperature is increased to 1070° C., for example, and the crystal growth is performed to form a high temperature growing part 117b. Therefore, the growth of GaN:Si crystals proceeds generally at a speed higher than that of the first stage, but a growth speed from the seed crystal part 115 in the transverse direction is higher than that in the upward direction, so that they grow mainly in the transverse direction. Therefore, in the high temperature growing part 117b, a height H thereof is not substantially increased compared with that in the first stage, but a width W thereof is increased rapidly. As the growth is continued, the crystals mutually connect approximately at a center of a region corresponding to a region between the seed crystal parts 115, and one sequential layer is formed. When the crystals are grown until an upper surface of the layer becomes flat, the nitride semiconductor layer 107 shown in FIG. 10D is completed.

Here, a spreading situation of the dislocation inside the nitride semiconductor layer 117 is the same as that of the nitride semiconductor layer 107 in the first embodiment. Therefore, the dislocation is extremely decreased not only in the region formed by the transverse growth but also in a region above the seed crystal part 115, and a low-defect region of the surface of the nitride semiconductor layer 117 spreads. Moreover, the region above the seed crystal part 115 is mainly composed of the low temperature growing parts 117a, so few hillocks occur on the surface of the nitride semiconductor layer 117. The growth temperature is gradually changed also in the modification to form the nitride semiconductor layer 117, and other growth conditions such as growth pressure may gradually be changed.

As described above, the step of growing the nitride semiconductor layer 117 is divided into two stages with changing the growth temperature also in the modification, so the same effects as the first embodiment can be obtained.
[Second Embodiment]

Figure 11A:
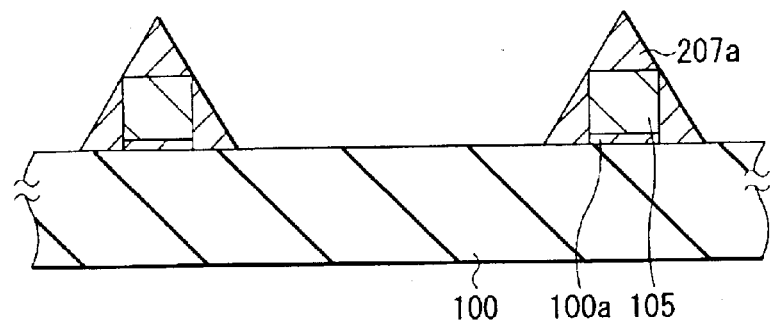
FIGS. 11A to 11C are cross sectional views respectively for explaining steps of a manufacturing method of a nitride semiconductor according to a second embodiment of the invention.
Figure 11B:
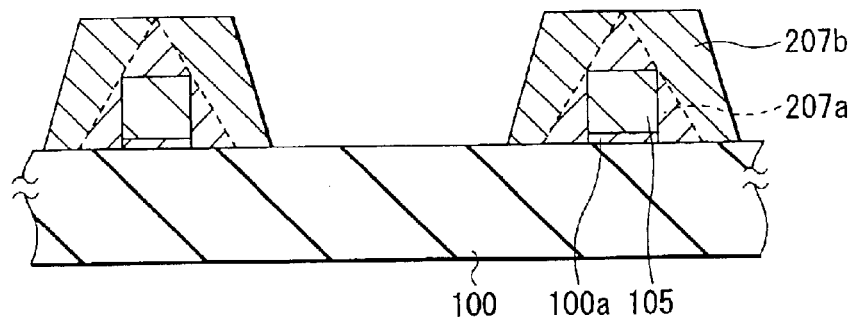
Figure 11C:
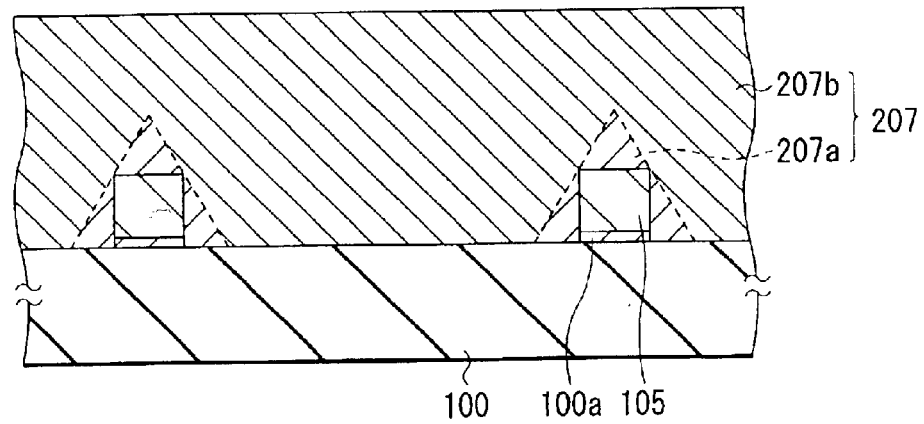
Figure 12A:
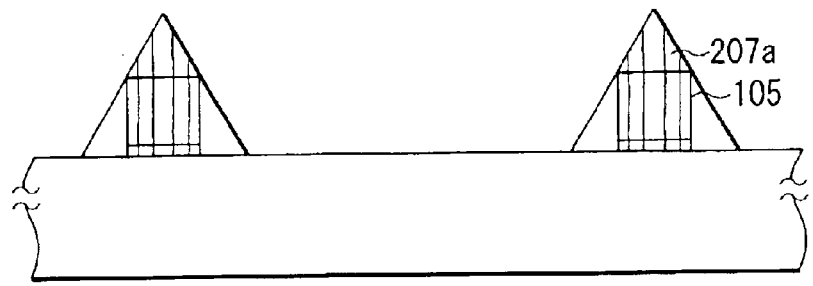
FIGS. 12A to 12C are views for explaining occurrence of dislocation density which respectively correspond to the steps of manufacturing the nitride semiconductor.
Figure 12B:
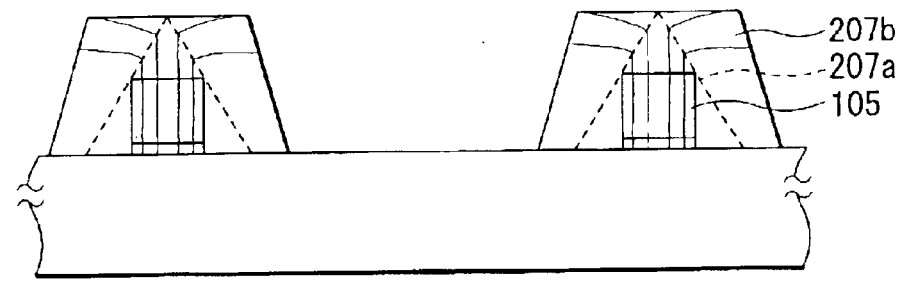
Figure 12C:
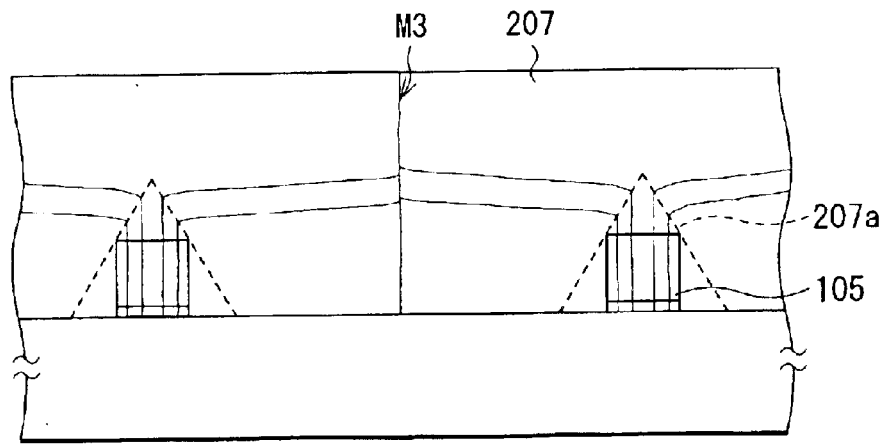

FIGS. 11A–11C show manufacturing steps of a nitride semiconductor according to a second embodiment in order, and FIGS. 12A–12C show a dislocation situation spreading in a crystal growth process corresponding to the manufacturing steps. A nitride semiconductor layer 207 is formed from the seed crystal parts 105 in the embodiment, and crystal growth is performed in two stages changing a growth temperature. Here, the steps until the seed crystal parts 105 are formed are the same as those of the first embodiment (referring to FIGS. 1A–1D), so the same signs are given to the same components and explanation thereof is omitted.

The seed crystal parts 105 are pre-formed on the buffer layer 100a which is on the substrate 100, like the first embodiment. The seed crystal parts 105 have a stripe pattern and are separated mutually, for example, and a spreading direction thereof is a <11-00> direction. First, as shown in FIG. 11A, GaN:Si is grown based on the seed crystal parts 105 to form second seed crystal parts 207a. At this time, a growth temperature is 1000° C. or below, for example, 970° C. This generates facets composed of the $\{11\bar{2}2\}$ surface, the second seed crystal parts 207a are surrounded by the facets and have a triangle shaped cross section. In addition, as shown in FIG. 12A, threading dislocation from the seed crystal part 105 is spread perpendicularly to an upper part of the second seed crystal part 207a.

Next, as shown in FIGS. 11B and 11C, a high temperature growing part 207b is grown based on the second seed crystal parts 207a. At this time, a growth temperature is 1050° C. or above, and crystal growth proceeds in a transverse direction as well as in a longitudinal direction perpendicular to the substrate. In such a growth process, facets composed of a crystal surface of $\{11\bar{2}0\}$ appear in the transverse direction as shown in FIG. 11B, and the high temperature growing part 207b has a square shaped cross section.

Moreover, as shown in FIG. 12B, inside the crystals, the dislocation is bent on the $\{11\bar{2}2\}$ facets, and spreads to the high temperature growing part 207b so that it is divided from the two $\{11\bar{2}2\}$ facet surfaces, which are right above the second seed crystal part 207a, into both sides of the second seed crystal part 207a. Therefore, little dislocation and few crystal defects exist in regions right above the second seed crystal parts 207a.

As the growth proceeds further, growing regions of the high temperature growing part 207b, which are mainly formed in the transverse direction, mutually connect approximately at a center of a region corresponding to the region between the seed crystal parts 105, and one sequential layer is formed. When the crystals are grown until an upper surface thereof becomes flat, the nitride semiconductor layer 207 shown in FIG. 11C is completed. At that time, as shown in FIG. 12C, the dislocation, which previously spreads to the high temperature growing part 207b, is bent in the transverse direction as the crystals grow, and hardly reaches a surface in the regions of the layer except for a connection part M3. Thereby, the nitride semiconductor layer 207 has a larger low-defect region in the surface.

The nitride semiconductor layer 207 which is manufactured in such a way is located so that the seed crystal parts 207a with the triangular shaped cross section may cover the seed crystal parts 105. The dislocation in the layer is bent on a boundary between the second seed crystal part 207a and the high temperature growing part 207b, and little dislocation occurs in the surface of the nitride semiconductor layer 207.

The growth temperature is gradually changed also in the embodiment, but the same nitride semiconductor layer as the nitride semiconductor layer 207 can be obtained also by changing a growth pressure. In detail, when the growth pressure is set to a high pressure such as 67 kPa (500 torr) or more in a stage of growing the second seed crystal part 207a, and the growth pressure is set to a low pressure such as 40 kPa (300 torr) or less in a following stage of growing the high temperature growing part 207b, the same effects as those when changing the temperature as described above is obtained, which is desirable. In addition, both of the temperature and the pressure may be simultaneously changed, and other growth conditions which provide the above same action to the crystal growth (such as atmosphere gas type) maybe treated similarly.

According to the embodiment, the step of growing the nitride semiconductor layer 207 is dividing into two stages with changing the growth temperature, and the second seed crystal parts 207a are formed to have the triangle shaped cross section in the first stage of the growth in the condition of the low temperature (or the high pressure), so that no dislocation spread from the second seed crystal part 207a to the upper region of the layer in the second stage of the growth, and the larger low-defect region can easily be formed in the surface of the nitride semiconductor layer 207.

Moreover, the nitride semiconductor layer 207 is grown based on the second seed crystal part 207a with the triangle shaped cross section, so little dislocation spread in the surface of the layer except for the connection part M3, which provides the large low-defect region to the surface.

[Modification]

A modification provides a seed crystal part with a shape different from the seed crystal part 105 of the second embodiment, and a manufacturing method comprising a step of forming the nitride semiconductor layer 217 being different from one of the second embodiment. Hereinafter, the manufacturing method will be described concretely.

Figure 13A:
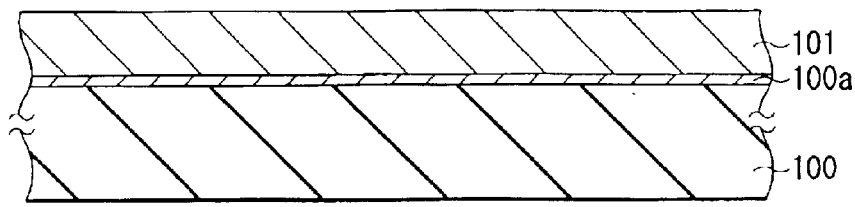
FIGS. 13A to 13D are cross sectional views respectively for explaining steps of a manufacturing method of a nitride semiconductor according to a modification of the second embodiment.

FIGS. 13A–13D show the above manufacturing method of the nitride semiconductor layer 217 in order of steps thereof. First, as shown in FIG. 13A, the buffer layer 100a, for example, made of GaN, AlN, AlGaN, or the like, and a seed crystal layer 201 made of GaN:Si are grown in order on the substrate 100 like the second embodiment.

Figure 13B:
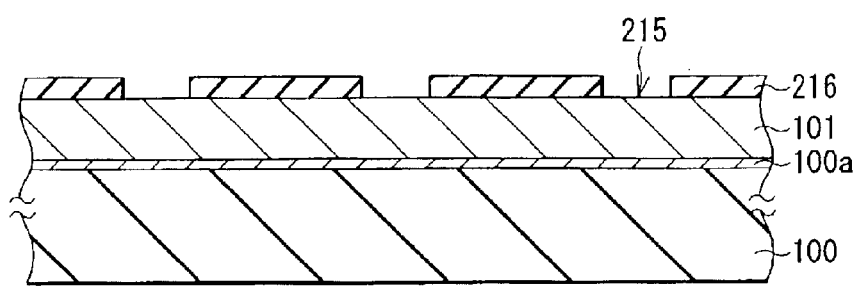

Next, as shown in FIG. 13B, a growth suppressing layer 216 made of $SiO_2$ (silicon dioxide) is grown on a surface of the seed crystal layer 201. The growth suppressing layer 216 is formed, for example, by sputtering, in order to have a desired shape with an opening, for example, a stripe pattern with a certain stripe width and cycle width, by means of a photo lithography technique and dry etching. Here, a part exposed from the opening of the seed crystal layer 201 becomes a seed crystal part 215. The seed crystal part 215 has a stripe pattern where they are separated mutually and a spreading direction is the <11-00> direction, for example.

Figure 13C:
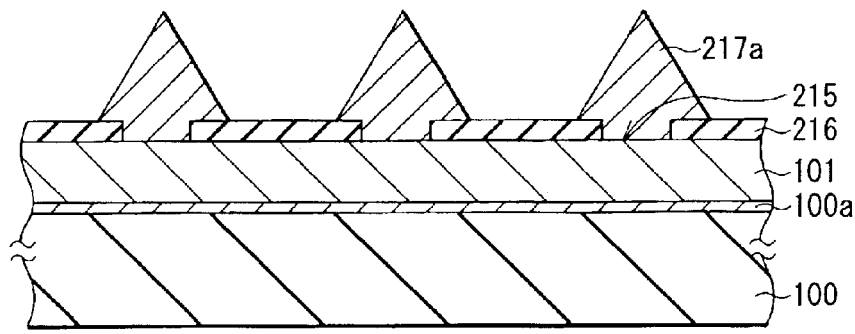

Next, as shown in FIG. 13C, GaN:Si is grown based on the seed crystal part 215 to form second seed crystal parts 217a. Here, a growth temperature is set to 1000° C. or below, for example, 970° C. Thereby, facets consisting of the {11$\bar{2}$0} surface are generated, and the second seed crystal parts 217a are formed to be surrounded with the facets and have a triangle shaped cross section. At this time, the threading dislocation from the seed crystal part 215 is perpendicularly extended to upper parts of the second seed crystal parts 217a.

Figure 13D:
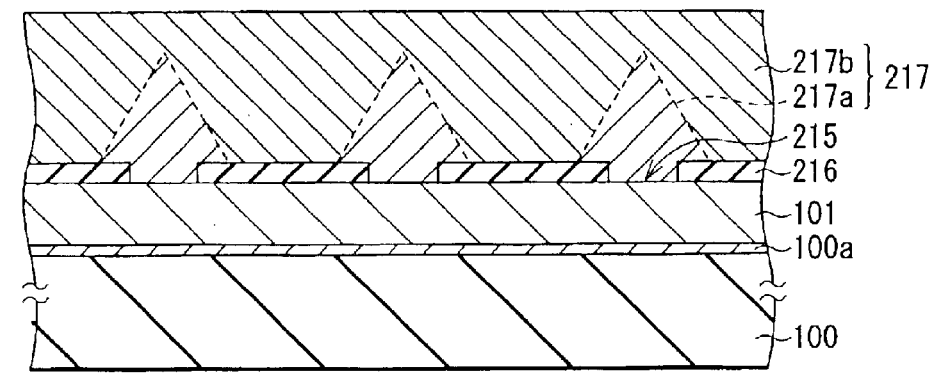

Next, a high temperature growing part 217b is grown based on the second seed crystal parts 217a. Here, a growth temperature is 1050° C. or over, and crystal growth proceeds in a transverse direction as well as in a longitudinal direction perpendicular to the, substrate. As the growth proceeds further, growing regions of the high temperature growing part 217b, which are mainly formed in the transverse direction, mutually connect approximately at a center of a region corresponding to the region between the seed crystal parts 215, and one sequential layer is formed. When the crystals are grown until an upper surface thereof becomes flat, the nitride semiconductor layer 217 shown in FIG. 13D is completed. A situation of the dislocation spreading in the growth step becomes the same as that of the nitride semiconductor layer 207 in the second embodiment. Thereby, little dislocation and few crystal defects exist in regions right above the second seed crystal parts 217a and the nitride semiconductor layer 217 has a larger low-defect region in the surface thereof.

The growth temperature is gradually changed also in the modification to form the nitride semiconductor layer 217, but other growth conditions such as a growth pressure may gradually be changed as described in the second embodiment.

Thus, the step of growing the nitride semiconductor layer 217 is divided into two stages with changing the growth temperature also in the modification, so that the same effects as those of the second embodiment can be obtained.

After growing the nitride semiconductor layers 207–217 as described above, a semiconductor layer can be grown thereon to manufacture a semiconductor device. Next, a semiconductor laser and a manufacturing method for the same will be described as an example of such a semiconductor device.

[Third Embodiment]

Figure 14:
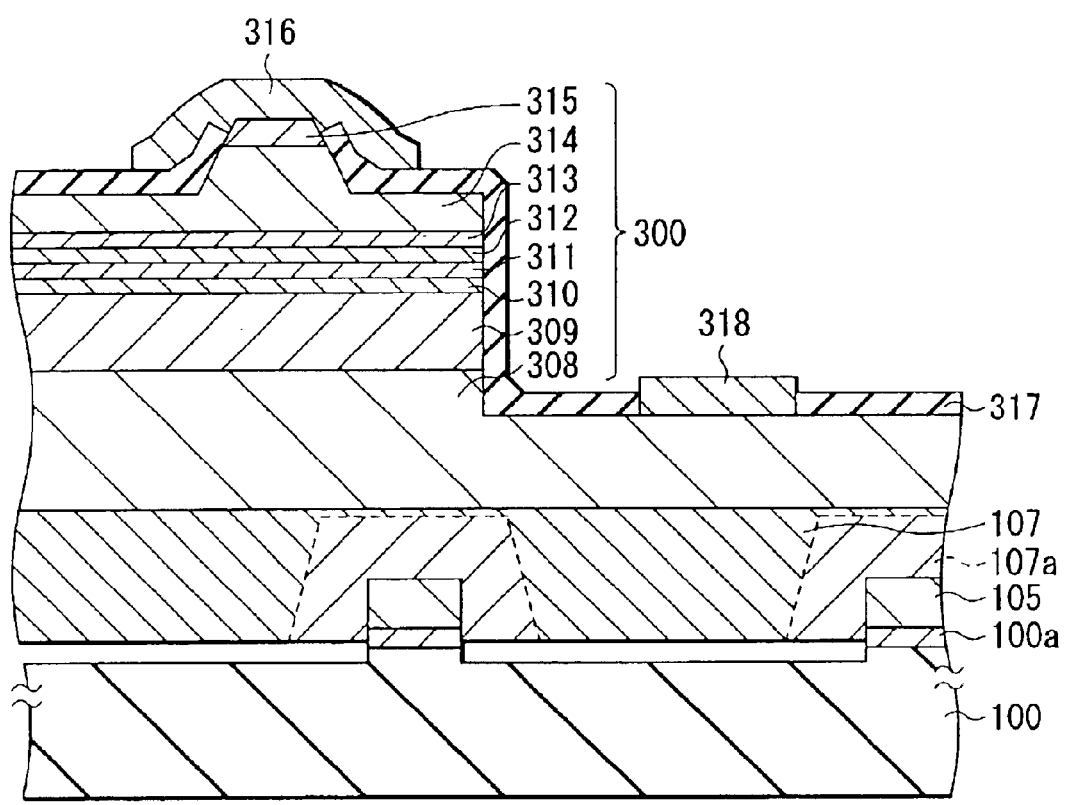
FIG. 14 is a cross sectional view of a semiconductor laser device according to a third embodiment of the invention.

FIG. 14 shows a cross sectional structure of a semiconductor laser according to a third embodiment. In the semiconductor laser, a semiconductor layer 300 (308–315) is formed on the nitride semiconductor layer 107 according to the first embodiment.

The semiconductor layer 300 consists of a nitride semiconductor, and is composed, for example, of a laminate of an n-side contact layer 308, an n-type cladding layer 309, an n-type guide layer 310, an active layer 311, a crystal degradation preventing layer 312, a p-type guide layer 313, a p-type cladding layer 314, and a p-side contact layer 315 in order from a side of the nitride semiconductor layer 107. Of them, for example, the n-side contact layer 308 is 1.5 $\mu$m in thickness and is composed of GaN:Si, the n-type cladding layer 309 is composed of n-type $Al_{0.08}Ga_{0.92}N$ with a thickness of 1.0 $\mu$m, and the n-type guide layer 310 is composed of n-type GaN with a thickness of 0.1 $\mu$m. On the other hand, an n-side contact layer of a laser usually needs a sufficient thickness in a direction of electric currents flowing in the layer. In the embodiment, not only the n-side contact layer 308 but also the nitride semiconductor layer 107 which is the same n-type GaN function as the substantial n-side contact layer.

The active layer 311 has a thickness of 30 nm and a multiple quantum well structure consisting of a $Ga_{0.98}In_{0.02}N/Ga_{0.92}In_{0.08}N$ multilayer. The active layer 311 has a current injection region which electric currents are injected, and the current injection region functions as a luminescence region.

The crystal degradation preventing layer 312 has a thickness of 5 nm–20 nm, and is composed of n-type $Al_{0.18}Ga_{0.82}N$, for example. The p-type guide layer 313 has a thickness of 0.1 $\mu$m, and is composed of p-type GaN, for example. The p-type cladding layer 314 has a thickness of 0.8 $\mu$m, and is composed of p-type $Al_{0.14}Ga_{0.86}N$/GaN, for example. The p-side contact layer 315 has a thickness of 0.5 $\mu$m, and is composed of p-type GaN, for example.

The layers from the p-side contact layer 315 to a part of the n-side contact layer 308 are formed to be a band-like protrusion (which is extended perpendicularly to the view in FIG. 14), and located in a predetermined region. This is a so-called laser stripe. A region where the n-side contact layer 308 is exposed is one for forming an n-side electrode 318 which will be described later.

Moreover, a part of the p-side contact layer 315 and the p-type cladding layer 314 are processed into a thin band-like protrusion, which spreads in the same direction as that of the laser stripe, to constitute a current confinement part. The current confinement part is for restricting the current injection region so that electric currents may be locally injected into the active layer 311. Therefore, the current injection region is located in a position corresponding to the current confinement part. Then, in order to prevent degradation of device properties, it is preferable to locate the current confinement part, which is a base of the current injection region, in a low defect region of the semiconductor layer. In such a case, the low-defect region corresponds to a region between the connection parts M1, but if the defects occur in the regions above the seed crystal parts 105, the low-defect region will correspond to a region between the seed crystal part 105 and the connection part M1.

On the semiconductor layer 300 is formed an insulating layer 317 made of silicon dioxide ($SiO_2$). The insulating layer 317 has partially openings in parts corresponding to the current confinement part and the n-side contact layer 308, and a p-side electrode 316 and an n-side electrode 318 are formed on the openings. The p-side electrode 316 has a structure where Ni (nickel), Pt, and Au are laminated in order, and is electrically connected with the p-side contact layer 315. The n-side electrode 318 has a structure where Ti (titanium), Al (aluminum), Pt (platinum), and Au (gold) are laminated in order, and is electrically connected with the n-side contact layer 308.

Moreover, in the laser, a pair of sides facing each other in an extended direction of the laser stripe is a resonator end surface, and a pair of reflecting mirror films, which is not shown, is attached to the pair of the resonator end surfaces. These reflecting mirror films are designed so that reflection factors thereof may differ. Thereby, light generated in the active layer 311 goes and returns between the reflecting mirrors to be amplified, and is emitted as a laser beam from the reflecting mirror film having the lower reflection factor.

The semiconductor laser can be manufactured as follows, for example.

First, for example, the semiconductor layer 300 (308–315) is grown on a flat surface of the nitride semiconductor layer 107 formed by the method of the first embodiment, using the MOCVD or the like. That is, the n-side contact layer 308 with a thickness of 1.5 $\mu$m made of GaN:Si, the n-type cladding layer 309 with a thickness of 1.0 $\mu$m made of the n-type $Al_{0.08}Ga_{0.92}N$, and the guide layer 310 with a thickness of 0.1 $\mu$m made of the n-type GaN are grown. Thereon, the active layer 311 with the multiplex quantum well structure is formed using the $Ga_{0.98}In_{0.02}N$/$Ga_{0.92}In_{0.08}N$ multilayer. Further, thereon are grown the crystal degradation preventing layer 312 made of the n-type $Al_{0.18}Ga_{0.82}N$, the guide layer 313 with a thickness of 0.1 $\mu$m made of the p-type GaN, the p-type cladding layer 314 with a thickness of 0.5 $\mu$m made of the p-type $Al_{0.14}Ga_{0.86}N$/GaN, and the p-side contact layer 315 with a thickness of 0.1 $\mu$m made of the p-type GaN. Here, the semiconductor layer 300 is grown on the flat surface of the nitride semiconductor layer 107 which has few defects such as the hillock and dislocation, so that the dislocation and the defects resulted from the crystal substrate are reduced in each of the layers. Moreover, the nitride semiconductor layer 107 is thin, so that the internal stress is hardly increased and occurrence of curvature is inhibited.

Next, for example, the p-side contact layer 315 and the p-type cladding layer 314 are patterned into a thin band shape by dry etching to form the current confinement part. As described above, it is especially preferable to form the current confinement part in an upper part corresponding to the low-defect region between the connection parts M1 (FIG. 5A). This is because when a position of a luminescence region being determined by a position of the current confinement part is aligned with a low-defect part of the active layer 311, degradation of the device properties can be prevented. Furthermore, it is preferable to form the current confinement part corresponding to the region between the seed crystal part 105 and the connection part M1 in order to more surely locate the luminescence region in the region with a low dislocation density. In the semiconductor layer 300, the defects occur intensively around the connection part M1, and the region between the connection parts M1 is substantially a large low-defect region. Therefore, it is not necessary to have a large margin from the connection part M1, and it is comparatively easily possible to perform alignment of the current confinement part. Or it is not necessary to exactly limit a formation position of the current injection region, and this can avoid difficulties due to accuracy in the manufacturing processes.

Then, a predetermined part from the p-type cladding layer 314 to the n-side contact layer 308 is removed by a photolithography method or the like to expose the n-side contact layer 308, and to provide a formation region of the n-side electrode 318. Then, a whole exposed part from the n-side contact layer 308 to the p-side contact layer 315 is covered with the insulating film 317, the n-side electrode 318 is formed on the n-side contact layer 308, and the p-side electrode 316 is formed over the p-side contact layer 315. Here, the n-side electrode 318 is formed by depositing Ti (titanium), Al (aluminum), Pt (platinum), and Au (gold) in order, for example. Moreover, the p-side electrode 316 is formed by depositing Ni (nickel), Pt, and Au in order, for example. Thereby, the semiconductor laser shown in FIG. 14 is obtained.

In the semiconductor laser, when a predetermined voltage is applied between the p-side electrode 316 and the n-side electrode 318, an electric current is injected into the active layer 311, and luminescence occurs resulting from electron-hole recombination. The light is reflected from the reflecting mirror film, which is not shown, to generate a laser, and is emitted outside as a beam. Here, the semiconductor layer 300 is grown on the nitride semiconductor layer 107, so that the defect density of the semiconductor layer 300 is low. Especially, when the current injection region of the active layer 311 is located corresponding the region between the connection parts M1, the defect density of the current injection region becomes low. Therefore, degradation of the device hardly occurs and a life thereof becomes long.

As described above, according to the embodiment, the semiconductor layer 300 is grown on the nitride semiconductor layer 107 which has the large low-defect region in the surface thereof, which can reduce the defects of the semiconductor layer 300 and improve crystallinity thereof. Therefore, degradation due to applying the voltage hardly occurs, and the life of the semiconductor laser can be prolonged. Moreover, the non-radiative recombination resulting from the threading dislocation or the like can be reduced, and luminescence efficiency can be improved.

Moreover, when the current injection region of the active layer 311 is located corresponding to the region between the connection parts M1, luminescence efficiency can be improved more. Furthermore, the region between the connection parts M1 is wide enough compared with a width of a conventional current injection region, so that a design margin of the current injection region can be enlarged, and such a semiconductor laser can be manufactured easily.

Furthermore, the semiconductor layer 300 is grown on the formed nitride semiconductor layer 107 with a small thickness, which reduces the stress generated in the nitride semiconductor layer 107, and prevents the curvature of the device.

[Fourth Embodiment]

Figure 15:
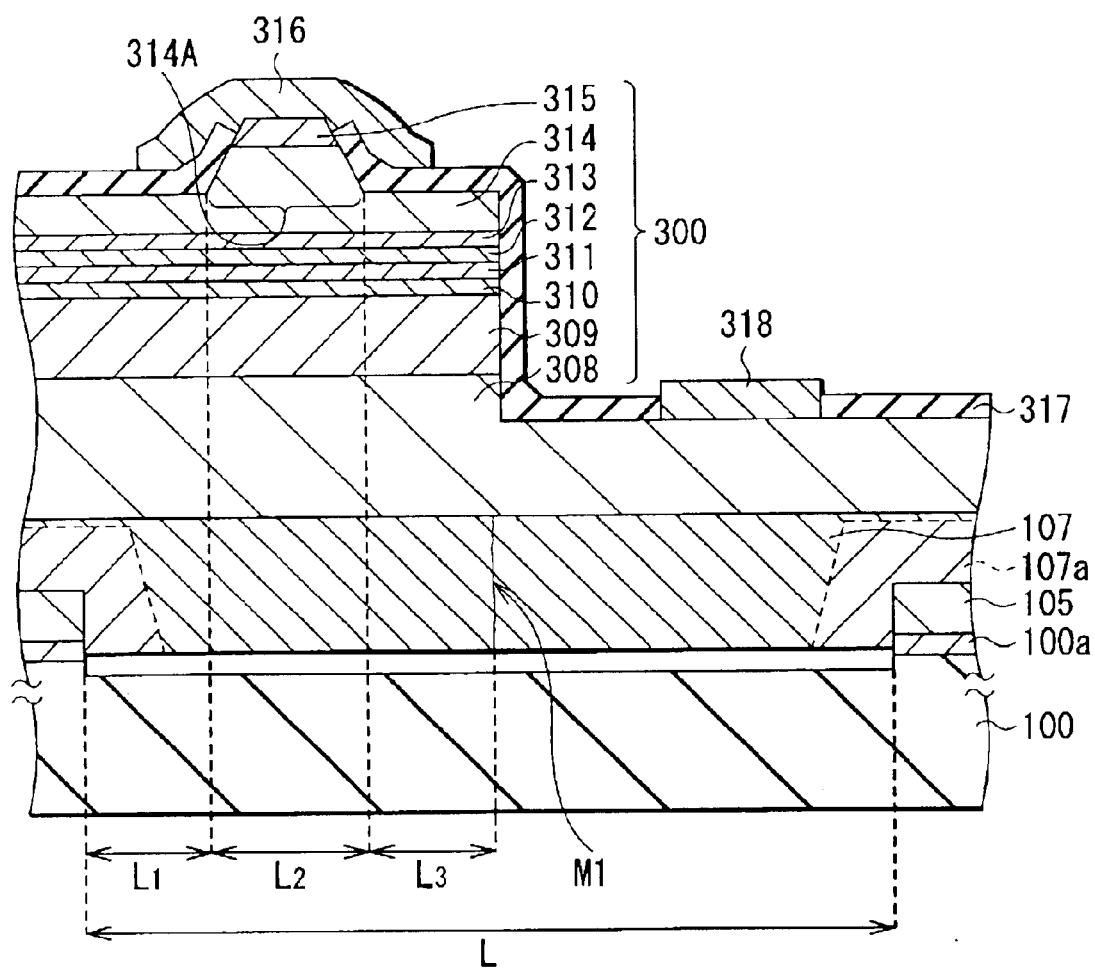
FIG. 15 is a cross sectional views of a semiconductor laser device according to a fourth embodiment of the invention.

FIG. 15 shows a cross sectional structure of a semiconductor laser according to a fourth embodiment. The semiconductor laser has the same structure as the third embodiment except for a more specified position in which a current confinement part 314A is located corresponding to the region between the seed crystal parts 105. Therefore, the same signs are given to the same components, explanation thereof is omitted, and different parts will be explained in detail.

The current confinement part 314A is located satisfying conditions that a sum of a distance $L_1$ between the seed crystal part 105 and the current confinement part 314A and a distance $L_3$ between the current confinement part 314A and the connection part M1 is 4 $\mu$m or more and a width $L_2$ of the current confinement part 314A is not less than 1 $\mu$m nor more than 3 $\mu$m. Or the current confinement part 314A is located satisfying conditions that the sum of the distance $L_1$ and the distance $L_3$ is 5 $\mu$m or more and the width $L_2$ of the current confinement part 314A is not less than 1.3 $\mu$m nor more than 2.5 $\mu$m. Here, the distance $L_1$ and the distance $L_3$ are equal. Or the distance $L_1$ and the distance $L_3$ may be substantially equal. This is because when the current confinement part 314A is simply located corresponding to the low-defect region of the semiconductor layer, it is not necessarily required that the distances $L_1$ and $L_3$ are completely equal.

The semiconductor laser having such a structure can be manufactured as follows.

First, for example, the semiconductor layer 300 (308–315) is grown on a flat surface of the nitride semiconductor layer 107 formed by the method of the first embodiment, using the MOCVD or the like, as well as the third embodiment.

Next, for example, the p-side contact layer 315 and the p-type cladding layer 314 are patterned into a thin band shape by dry etching to form the current confinement part 314A. Here, it is preferable to form the current confinement part 314A corresponding to the region between the seed crystal part 105 and the connection part M1 in order to more surely locate the luminescence region in the region with the low dislocation density.

Specifically, a length of a region between the seed crystal parts 105 and the connection part M1 except for the region corresponding to the current confinement part 314A, that is, the sum $(L_1+L_3)$ of the distance $L_1$ between the seed crystal part 105 and the current confinement part 314A and the distance $L_3$ between the current confinement part 314A and the connection part M1, is set to 4 $\mu$m or more ($L_2 \leq L/2 \cdot 4$). This is because when the sum of the distances $L_1$ and $L_3$ is less than 4 $\mu$m, a risk that the current confinement part 314A is formed above the defect region is increased. A distance between the seed crystal parts 105 is expressed by L ($\mu$m).

The width $L_2$ of the current confinement part 314A is not less than 1 $\mu$m nor more than 3 $\mu$m ($1 \leq L_2 \leq 3$). One reason is that when the width $L_2$ of the current confinement part 314A is less than 1 $\mu$m, the current confinement part 314A is not formed above the defect region, but a threshold voltage $V_{OP}$ of the semiconductor laser is increased. Another reason is that when the width $L_2$ is more than 3 $\mu$m, the threshold voltage $V_{OP}$ is decreased, but a threshold current $I_{OP}$ is increased, a kink level is decreased, and there is a high risk that the current confinement part 314A is formed above the defect region. Here, the distance $L_1$ between the seed crystal part 105 and the current confinement part 314A and the distance $L_3$ between the current confinement part 314A and the connection part M1 are set to be equal. Or the distance $L_1$ and the distance $L_3$ may be substantially equal. This is because when the current confinement part 314A is simply located corresponding to the low-defect region of the semiconductor layer, it is not necessarily required that the distances $L_1$ and $L_3$ are completely equal.

In FIG. 15, the current confinement part 314A is located corresponding to the region between the seed crystal parts 105, which is on the left side from the connection part M1, and the connection part M1, but it is clear that the current confinement part 314A may be located in the region between the right side seed crystal part 105 and the connection part M1, because the low-defect region is symmetrical about the connection part M1.

Figure 16A:
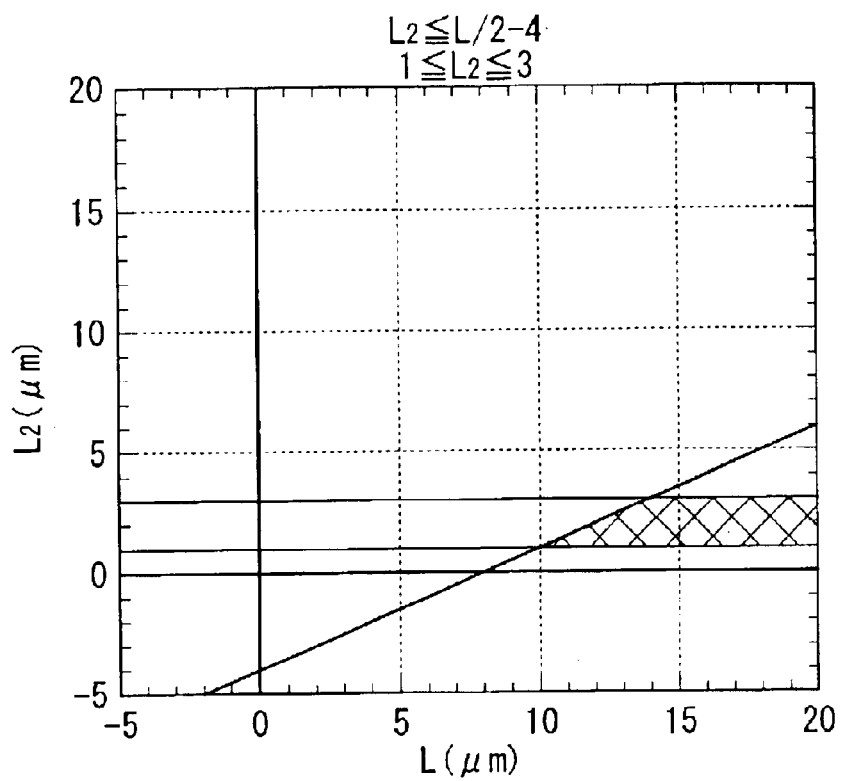
FIGS. 16A and 16B are views for explaining a locating position of a current confinement part between seed crystal parts.
Figure 16B:
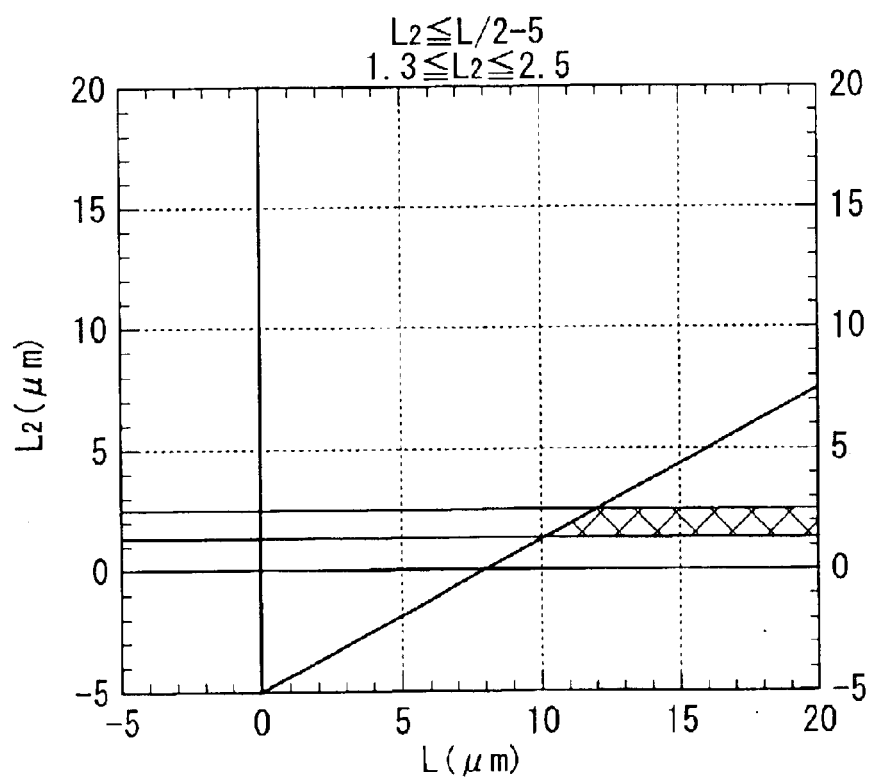

As described above, when the current confinement part 314A is located so that a relation among the distance L between the seed crystal parts 105, the distance $L_1$ between the seed crystal part 105 and the current confinement part 314A, the width $L_2$ of the current confinement part 314A, and the distance $L_3$ between the current confinement part 314A and the connection part M1 in the low-defect region of the semiconductor layer satisfies $L_2 \leq L/2-4$ and $1 \leq L_2 \leq 3$ as shown in FIG. 16A, the current confinement part 314A is formed above the low-defect region, the kink level is increased, and the threshold voltage $V_{OP}$ and the threshold current $I_{OP}$ are decreased.

Figure 17A:
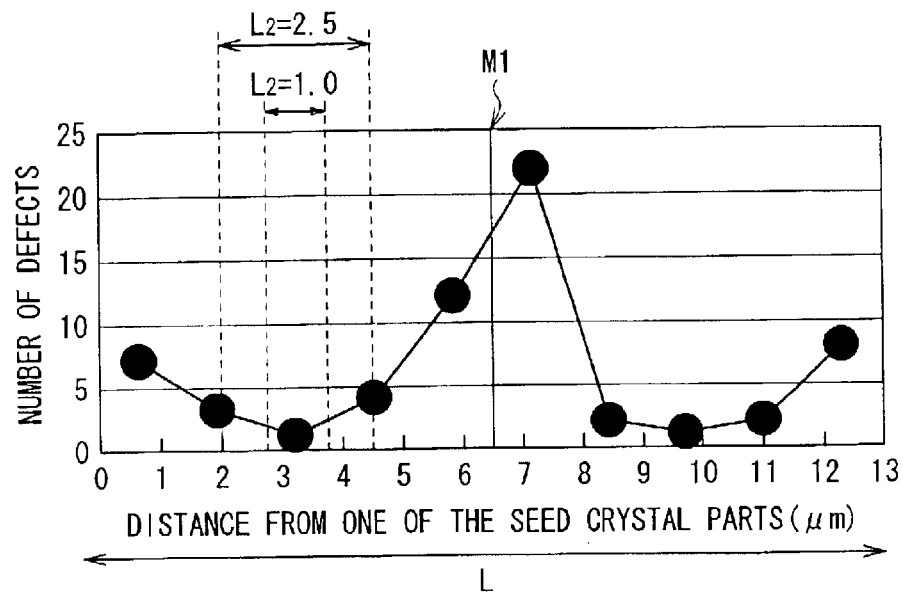
FIGS. 17A and 17B are views for explaining a locating position of the current confinement part between the seed crystal parts.
Figure 17B:
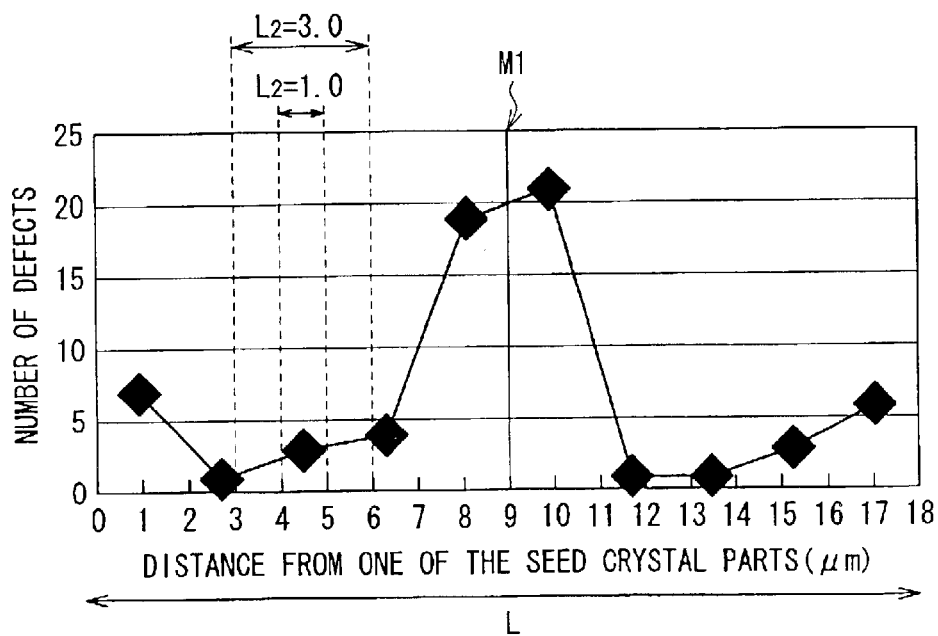

Here, as shown in FIG. 17A, in the case of L=13, when $L_2 \leq 2.5$ and $1 \leq L_2 \leq 3$, that is, $1 \leq L_2 \leq 2.5$ was satisfied, it was confirmed that the current confinement part 314A was formed above the low-defect region. Moreover, as shown in FIG. 17B, in the case of L=18, when $L_2 \leq 5$ and $1 \leq L_2 \leq 3$, that is, $1 \leq L_2 \leq 3$ was satisfied, it was confirmed that the current confinement part 314A was formed above the low-defect region.

Moreover, it is more suitable to locate the current confinement part 314A so that the relation among the distance L between the seed crystal parts 105, the distance $L_1$ between the seed crystal part 105 and the current confinement part 314A, the width $L_2$ of the current confinement part 314A, and the distance $L_3$ between the current confinement part 314A and the connection part M1 satisfies $L_2 \leq L/2-5$ and $1.3 \leq L_2 \leq 2.5$ in the low-defect region of the semiconductor layer. Because it is more probable that the current confinement part 314A is formed above the low-defect region, when these relational expression are satisfied.

Figure 18A:
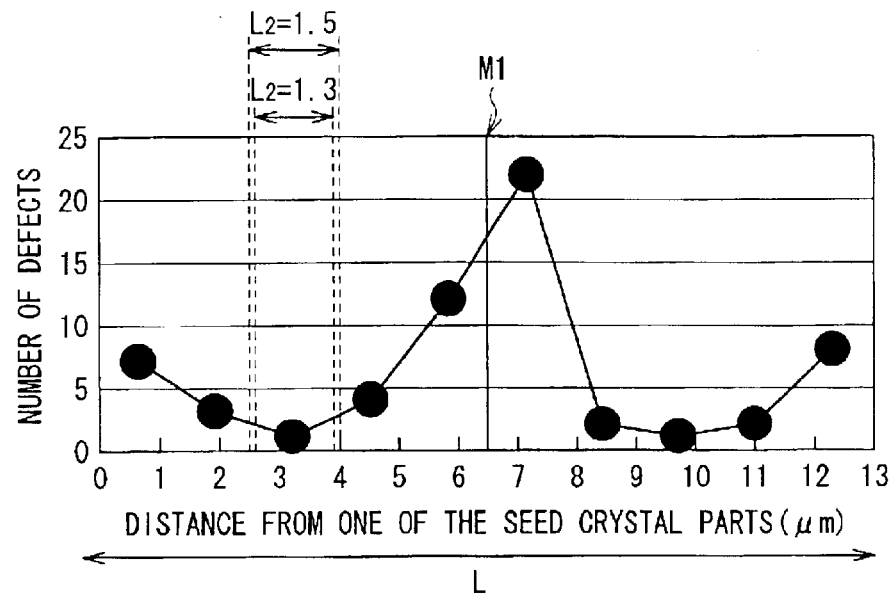
FIGS. 18A and 18B are views for explaining a locating position of the current confinement part between the seed crystal parts.
Figure 18B:
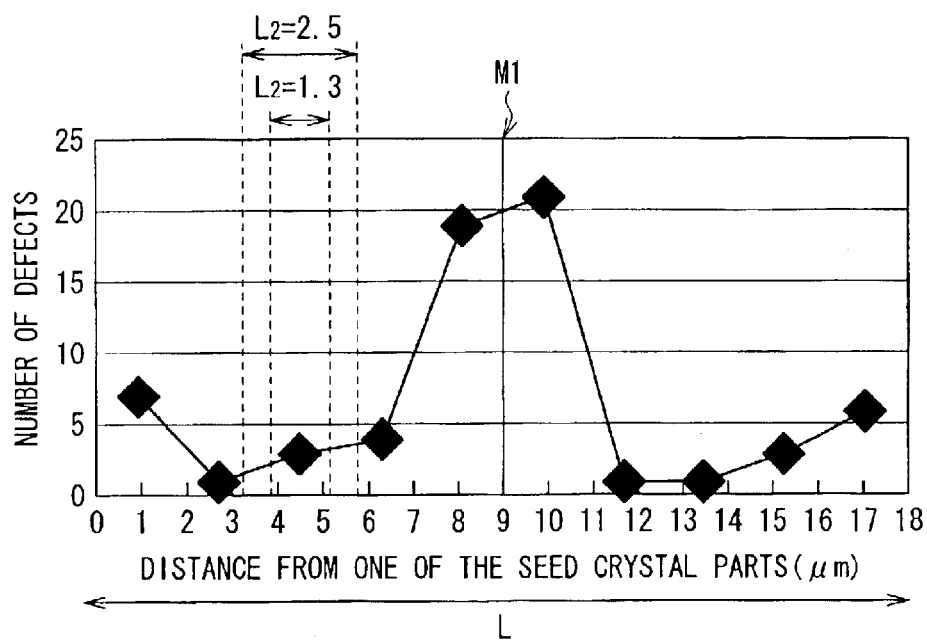

Here, as shown in FIG. 18A, in the case of L=13, when $L_2 \leq 1.5$ and $1.3 \leq L_2 \leq 3$, that is, $1.3 \leq L_2 \leq 1.5$ was satisfied, it was confirmed that the current confinement part 314A was formed above the low-defect region. Moreover, as shown in FIG. 18B, in the case of L=18, when $L_2 \leq 4$ and $1.3 \leq L_2 \leq 2.5$, that is, $1.3 \leq L_2 \leq 2.5$ was satisfied, it was confirmed that the current confinement part 314A was formed above the low-defect region.

Then, a predetermined part from the p-type cladding layer 314 to the n-side contact layer 308 is removed by the photolithography method or the like to expose the n-side contact layer 308, to provide the formation region of the n-side electrode 318. Then, a whole exposed part from the n-side contact layer 308 to the p-side contact layer 315 is covered with the insulating film 317, the n-side electrode 318 is formed on the n-side contact layer 308, and the p-side electrode 316 is formed over the p-side contact layer 315. Thereby, the semiconductor laser shown in FIG. 15 is obtained.

As described above, according to the embodiment, the current confinement part 314A is located so that $L_2 \leq L/2-4$, and $1 \leq L_2 \leq 3$ is satisfied, and thus the current confinement part 314A is formed above the low-defect region, the threshold voltage $V_{OP}$ and the threshold current $I_{OP}$ are decreased, and the kink level is increased.

Furthermore, the current confinement part 314A is located so that $L_2 \leq L/2-5$ and $1.3 \leq L_2 \leq 2.5$ is satisfied, and thus the current confinement part 314A is more surely formed above the low-defect region, the threshold voltage $V_{OP}$ and the threshold current $I_{OP}$ is further decreased, and the kink level is further increased.

Figure 19:
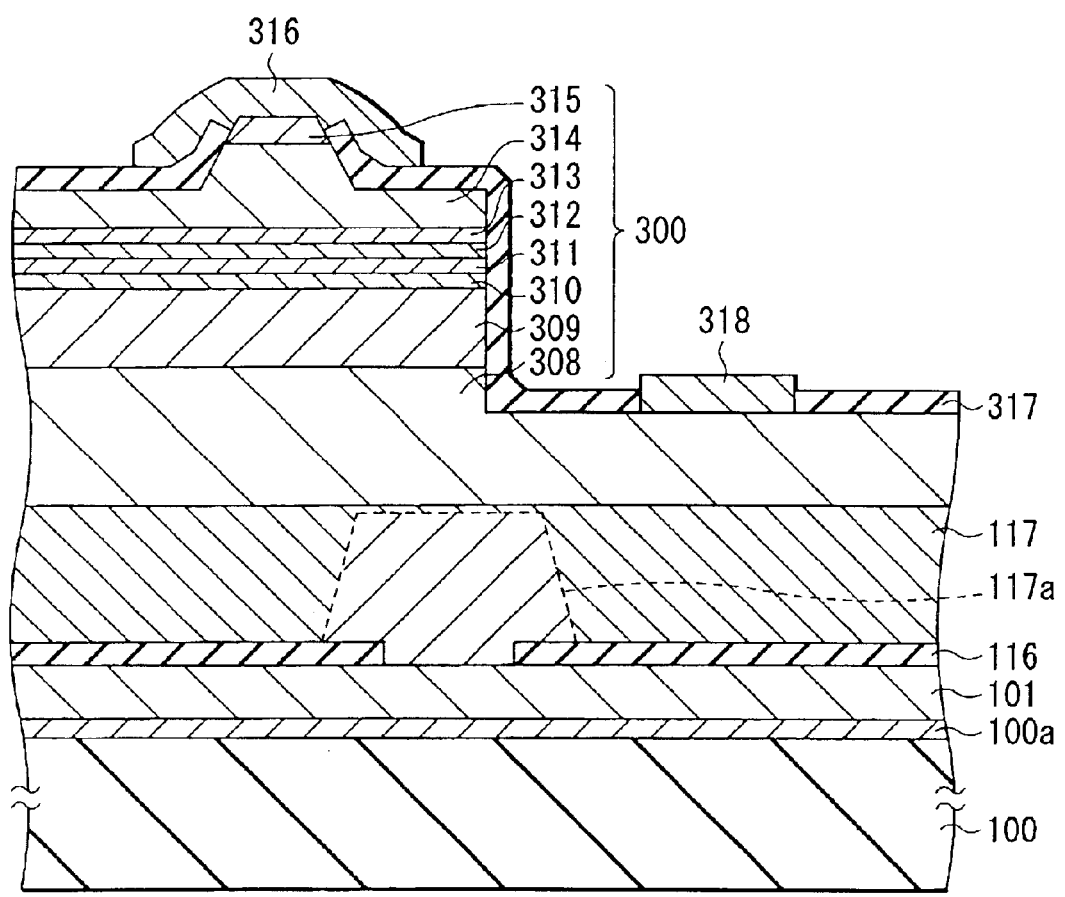
FIG. 19 is a cross sectional view of another semiconductor laser device according to the invention.

Although the invention has been described by the foregoing embodiment and Examples, the invention is not limited to the embodiments and Examples but can be variously modified. For example, in the third embodiment the semiconductor laser is manufactured using the nitride semiconductor layer 107 formed by the method of the first embodiment, but other nitride semiconductors of the invention may be used and the same effects as those of the third embodiment can also be obtained in such a case. For example, FIG. 19 shows a cross sectional structure of a semiconductor laser which is manufactured by forming the nitride semiconductor layer 117 in reference to the modification of the first embodiment and thereon forming the semiconductor layer 300. Also in the above case, the current confinement part is located corresponding to the region between the connection parts M1. Moreover, when the nitride semiconductor layers 207 and 217 in the second embodiment and its modification are used, the defects of the region over the seed crystal parts can be decreased more effectively, crystallinity of the semiconductor layer 300 can be improved, and the larger margin of the region for locating the current confinement part can be obtained.

Figure 20:
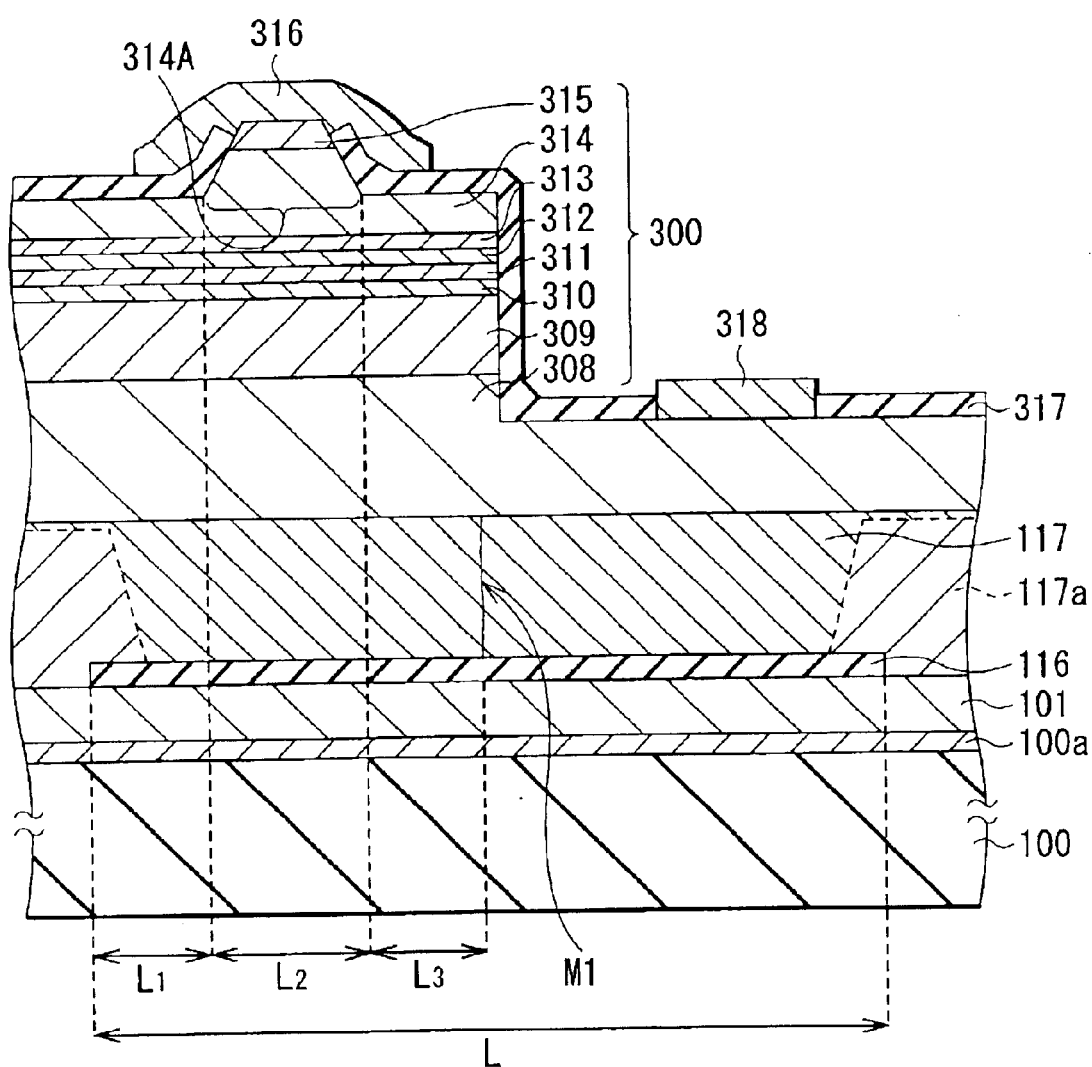
FIG. 20 is a cross sectional view of still another semiconductor laser device according to the invention.

Moreover, for example, in the fourth embodiment the semiconductor laser is manufactured using the nitride semiconductor layer 107 formed by the method of the first embodiment, but other nitride semiconductors of the invention may be used and the same effects as those of the fourth embodiment can also be obtained in such a case. For example, FIG. 20 shows a cross sectional structure of a semiconductor laser which is manufactured by forming the nitride semiconductor layer 117 in reference to the modification of the first embodiment and thereon forming the semiconductor layer 300. Also in the above case, when the current confinement part 314A is located so that $L_2 \leq L/2-4$, and $1 \leq L_2 \leq 3$ is satisfied, the current confinement part 314A is formed above the low-defect region, the threshold voltage $V_{OP}$ and the threshold current $I_{OP}$ are decreased, and the kink level is increased. Furthermore, when the current confinement part 314A is located so that $L_2 \leq L/2-5$ and $1.3 \leq L_2 \leq 2.5$ is satisfied, the current confinement part 314A is formed above the low-defect region, the threshold voltage $V_{OP}$ and the threshold current Iop is further decreased, and the kink level is further increased.

Figure 21:
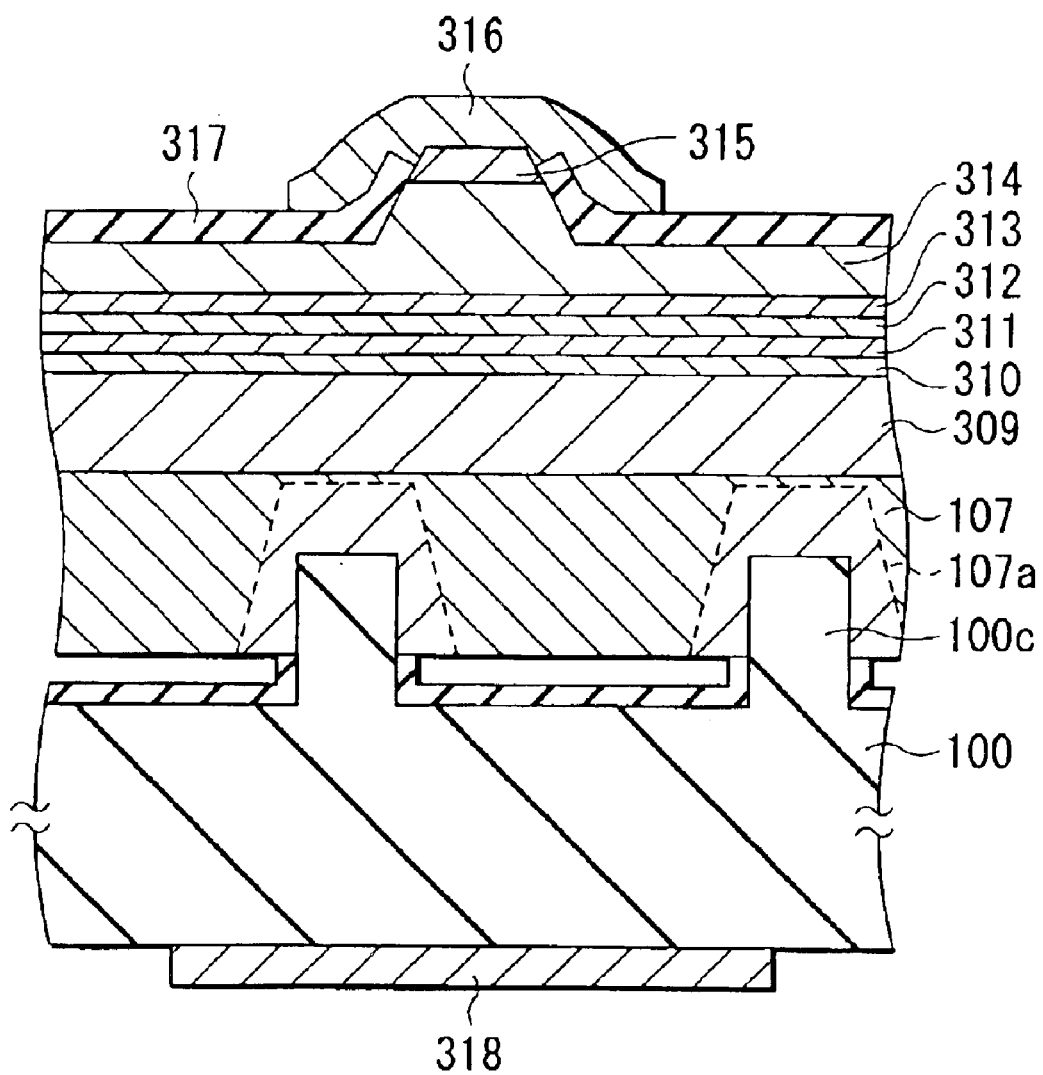
FIG. 21 is a cross sectional view of still another semiconductor laser device according to the invention.

Furthermore, the case of using the substrate 100 made of sapphire or the like has been described in the above embodiment, but the invention is applicable similarly to cases of using the substrate made of another material. When the n-side electrode is located on a rear surface of the substrate in a case of using a GaN substrate especially, it is not necessary to process the top surface of the substrate for locating the n-side electrode and to locate the n-side contact layer. Thus the manufacturing steps can be simplified and the laser can be miniaturized. In such a case, as shown in FIG. 21, a seed crystal part 100c may be directly formed on a whole surface of the GaN substrate 100, and the semiconductor layer 300 can be formed on the nitride semiconductor layer 107, which is grown from the seed crystal part 100c, to manufacture the laser.

Furthermore, the invention is similarly applicable to cases of separating the nitride semiconductor layers 107–217, which are produced on the sapphire substrate or the like as described in the embodiment, from the substrate and thereon manufacturing the semiconductor device such as the laser.

Furthermore, the surface of the substrate is the {0001} surface in the above embodiment, but other surfaces may be used. Similarly, the seed crystal part is extended in the <1$\overline{1}$00> direction in the above embodiment, but it may be extended in another direction. Moreover, the slant faces of the second seed crystal part are not necessarily limited to be the {11$\overline{2}$2} surface or the {11$\overline{2}$0} surface. In addition, the shape of the seed crystal part is not be limited to the stripe pattern, and may be a grid shape or an island shape, for example.

Moreover, the semiconductor device is illustrated with the semiconductor laser in the above embodiments, and the structure thereof is concretely described, but the invention is similarly applicable to semiconductor lasers having other structure. For example, it is not necessarily required to comprise the n-type guide layer 110 and the p-type guide layer 113, or the degradation preventing layer 112. Furthermore, the semiconductor laser with a ridge waveguide type, which is combination of a gain waveguide type and a refraction waveguide type, has been described as an example in the above embodiment, but the invention is similarly applicable to a gain waveguide type semiconductor laser and a refraction waveguide type semiconductor laser.

Moreover, the semiconductor laser has been described as an example of the semiconductor device in the above embodiments, the invention is applicable also to other semiconductor devices such as a light emitting diode and a field-effect transistor.

According to the nitride semiconductor and the semiconductor device of the invention, both of them comprise the second seed crystal part having the triangle or trapezoid shaped cross section and the semiconductor layer being grown based on the second seed crystal part, so that the dislocation in the crystals is bent on the interface between the second seed crystal part and the semiconductor layer, the low-defect region of the surface thereof can be enlarged, and the hillocks can be decreased. Therefore, in the semiconductor device formed using the nitride semiconductor, the defects inside the semiconductor layer can be reduced, and dependability and stability thereof can be improved.

According to the semiconductor device of one aspect of the invention, the sum of the distance between the first seed crystal part and the current confinement part and the distance between the current confinement part and the connection part is set to 4 $\mu$m or more and the width of the current confinement part is set to be not less than 1 $\mu$m nor more than 3 $\mu$m, so that the current confinement part is formed above the low-defect region, the threshold voltage and the threshold current are decreased, and the kink level is increased. Therefore, the dependability and the stability of the semiconductor device can be improved further.

According to the semiconductor device of another aspect of the invention, the sum of the distance between the first seed crystal part and the current confinement part and the distance between the current confinement part and the connection part is set to 5 µm or more and the width of the current confinement part is set to be not less than 1.3 µm nor more than 2.5 µm, so that the current confinement part is formed above the low-defect region, the threshold voltage and the threshold current are further decreased, and the kink level is further increased. Therefore, the dependability and the stability of the semiconductor device can be improved further.

According to the manufacturing method for the nitride semiconductor and the manufacturing method for the semiconductor device of the invention, both of the methods comprise the step of growing the group III-V nitride semiconductor based on the seed crystal part with changing at least one of the growth conditions in two or more stages to form the semiconductor layer, so that the crystals near the seed crystal part and between the seed crystal parts are grown respectively in different conditions, and the dislocation in the crystals is bent on the interface between the second seed crystal part and the semiconductor layer. Therefore, the large low-defect region can be formed in the surface of the semiconductor layer, the occurrence of the hillocks can be prevented, and the dependability and the stability of the semiconductor device being formed using the nitride semiconductor can be improved. Moreover, the thickness of the layer is controlled, so that the semiconductor layer with the small thickness can be formed, and the curvature of the semiconductor device formed using the nitride semiconductor can be removed.

Obviously many modifications and variations of the present invention are possible in the light of the above teachings. It is therefore to be understood that within the scope of the appended claims the invention may be practiced otherwise than as specifically described.

What is claimed is:

1. A manufacturing method for a semiconductor device comprising the steps of:
   growing a group III-V nitride semiconductor to form a seed crystal part; and
   growing a group III-V nitride semiconductor based on the seed crystal part with changing at least one of growth conditions in two or more stages to form a semiconductor layer, wherein the second stage comprises the steps of:
   growing the semiconductor layer based on the second seed crystal part in a direction different from a thickness direction of the semiconductor layer to form a plurality of connection parts;
   forming an active layer having a current injection region above the plurality of connection parts; and
   forming a current confinement part which limits the current injection region of the active layer and is located corresponding to a region between the connection parts, wherein the current confinement part is formed corresponding to a region between the seed crystal part and the connection parts, wherein a sum of a distance between the seed crystal part and the current confinement part and a distance between the current confinement part and the connection part is 4 µm or more.

2. A manufacturing method for a semiconductor device according to claim 1, wherein a width of the current confinement part is not less than 1 µm nor more than 3 µm.

3. A manufacturing method for a semiconductor device comprising the steps of:
   growing a group III-V nitride semiconductor to form a seed crystal part; and
   growing a group III-V nitride semiconductor based on the seed crystal part with changing at least one of growth conditions in two or more stages to form a semiconductor layer, wherein the second stage comprises the steps of:
   growing the semiconductor layer based on the second seed crystal part in a direction different from a thickness direction of the semiconductor layer to form a plurality of connection parts;
   forming an active layer having a current injection region above the plurality of connection parts; and
   forming a current confinement part which limits the current injection region of the active layer and is located corresponding to a region between the connection parts, wherein the current confinement part is formed corresponding to a region between the seed crystal part and the connection parts, wherein a sum of a distance between the seed crystal part and the current confinement part and a distance between the current confinement part and the connection part is 5 µm or more.

4. A manufacturing method for a semiconductor device according to claim 3, wherein a width of the current confinement part is not less than 1.3 µm nor more than 2.5 µm.

5. A manufacturing method for a semiconductor device comprising the steps of:
   growing a group III-V nitride semiconductor to form a seed crystal part; and
   growing a group III-V nitride semiconductor based on the seed crystal part with changing at least one of growth conditions in two or more stages to form a semiconductor layer, wherein the second stage comprises the steps of:
   growing the semiconductor layer based on the second seed crystal part in a direction different from a thickness direction of the semiconductor layer to form a plurality of connection parts;
   forming an active layer having a current injection region above the plurality of connection parts; and
   forming a current confinement part which limits the current injection region of the active layer and is located corresponding to a region between the connection parts, wherein the current confinement part is formed corresponding to a region between the seed crystal part and the connection parts, wherein a distance between the seed crystal part and the current confinement part is equal to a distance between the current confinement part and the connection part.

6. A manufacturing method for a semiconductor device comprising the steps of:
   growing a group III-V nitride semiconductor to form a seed crystal part; and
   growing a group III-V nitride semiconductor based on the seed crystal part with changing at least one of growth conditions in two or more stages to form a semiconductor layer wherein the step of forming the semiconductor layer comprises a first stage of forming a second seed crystal part at a first temperature or at a first pressure; and a second stage of growing the semiconductor layer mainly in parallel with a substrate based on the second seed crystal part at a second temperature higher than the first temperature or at a second pressure lower than the first pressure, wherein a width of the current confinement part is not less than 1 µm nor more than 3 µm.

7. A manufacturing method for a semiconductor device comprising the steps of:
growing a group III-V nitride semiconductor to form a seed crystal part; and
growing a group III-V nitride semiconductor based on the seed crystal part with changing at least one of growth conditions in two or more stages to form a semiconductor layer wherein the step of forming the semiconductor layer comprises a first stage of forming a second seed crystal part at a first temperature or at a first pressure; and a second stage of growing the semiconductor layer mainly in parallel with a substrate based on the second seed crystal part at a second temperature higher than the first temperature or at a second pressure lower than the first pressure, wherein a distance between the seed crystal part and the current confinement part is equal to a distance between the current confinement part and the connection part.

* * * * *